United States Patent
Fujii et al.

(10) Patent No.: US 9,288,382 B2
(45) Date of Patent: Mar. 15, 2016

(54) IMAGING APPARATUS AND SOLID-STATE IMAGING DEVICE

(71) Applicant: PANASONIC CORPORATION, Osaka (JP)

(72) Inventors: Toshiya Fujii, Shiga (JP); Mitsuhiko Otani, Hyogo (JP); Kazutoshi Onozawa, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 24 days.

(21) Appl. No.: 14/495,016

(22) Filed: Sep. 24, 2014

(65) Prior Publication Data

US 2015/0009383 A1 Jan. 8, 2015

Related U.S. Application Data

(63) Continuation of application No. PCT/JP2013/007652, filed on Dec. 26, 2013.

(30) Foreign Application Priority Data

Jan. 30, 2013 (JP) .................................. 2013-016062

(51) Int. Cl.
*H04N 5/232* (2006.01)
*H04N 5/347* (2011.01)
(Continued)

(52) U.S. Cl.
CPC ...... *H04N 5/23212* (2013.01); *H01L 27/14627* (2013.01); *H04N 5/347* (2013.01); *H04N 5/374* (2013.01); *H04N 5/378* (2013.01); *H04N 9/045* (2013.01); *H01L 27/14643* (2013.01)

(58) Field of Classification Search
CPC ...................................................... H04N 5/3696
USPC ........................................................... 348/349
See application file for complete search history.

(56) References Cited

U.S. PATENT DOCUMENTS 4,410,804 A 10/1983 Stauffer
5,955,753 A 9/1999 Takahashi
(Continued)

FOREIGN PATENT DOCUMENTS

JP 58-024105 A 2/1983
JP 09-046596 A 2/1997
(Continued)

OTHER PUBLICATIONS

International Search Report issued in PCT/JP2013/007652, dated Mar. 11, 2014, with English translation.

*Primary Examiner* — Roberto Velez
*Assistant Examiner* — Cynthia Segura
(74) *Attorney, Agent, or Firm* — McDermott Will & Emery LLP

(57) ABSTRACT

An imaging apparatus includes: an optical lens; light receiving units each reading a photoelectric conversion signal; microlenses each placed for every two or more of the adjacent light receiving units; a signal generating unit generating (i) a full-addition signal by adding all of the photoelectric conversion signals obtained in a predetermined frame by the two or more adjacent light receiving units, (ii) a partial addition signal by adding the photoelectric conversion signals obtained by at least one but not all of the two or more adjacent light receiving units, and (iii) non-addition independent signals that are the photoelectric conversion signals of one of the light receiving units; a phase difference detecting unit detecting a focal point from the partial addition signal and the non-addition independent signals; and a camera YC processing unit generating a main image from the full-addition signal.

14 Claims, 29 Drawing Sheets

(51) Int. Cl.
  *H04N 5/374* (2011.01)
  *H04N 5/378* (2011.01)
  *H04N 9/04* (2006.01)
  *H01L 27/146* (2006.01)

(56) References Cited

U.S. PATENT DOCUMENTS

| | | | |
|---|---|---|---|
| 6,750,437 B2 | 6/2004 | Yamashita et al. | |
| 9,117,718 B2* | 8/2015 | Ohshitanai | H01L 27/14625 |
| 2002/0036257 A1 | 3/2002 | Yamashita et al. | |
| 2010/0232776 A1* | 9/2010 | Ohnishi | H04N 5/23212 |
| | | | 396/104 |
| 2013/0076972 A1* | 3/2013 | Okita | H04N 5/23212 |
| | | | 348/360 |
| 2013/0087875 A1* | 4/2013 | Kobayashi | H01L 27/1461 |
| | | | 257/432 |
| 2013/0182158 A1* | 7/2013 | Kobayashi | H01L 31/02 |
| | | | 348/294 |
| 2013/0335618 A1* | 12/2013 | Sugawara | H04N 5/23212 |
| | | | 348/349 |
| 2014/0160335 A1* | 6/2014 | Shimotsusa | H01L 27/1463 |
| | | | 348/311 |
| 2015/0264335 A1* | 9/2015 | Park | H04N 13/0235 |
| | | | 348/49 |

FOREIGN PATENT DOCUMENTS

| | | |
|---|---|---|
| JP | 2002-101341 A | 4/2002 |
| JP | 2007-065330 A | 3/2007 |
| JP | 2012-128248 A | 7/2012 |

* cited by examiner

FIG. 8

| Column Row | a | b | c | d | e | f | g | h | |
|---|---|---|---|---|---|---|---|---|---|
| 1 | R1a | R1b | G1c | G1d | R1e | R1f | G1g | G1h | → Not selected |
| 2 | G2a | G2b | B2c | B2d | G2e | G2f | B2g | B2h | → Not selected |
| 3 | R3a | R3b | G3c | G3d | R3e | R3f | G3g | G3h | → Not selected |
| 4 | G4a | G4b | B4c | B4d | G4e | G4f | B4g | B4h | → Not selected |
| 5 | R5a | R5b | G5c | G5d | R5e | R5f | G5g | G5h | → Not selected |
| 6 | G6a | G6b | B6c | B6d | G6e | G6f | B6g | B6h | → Not selected |
| 7 | R7a(1) | R7b(2) | G7c(3) | G7d(4) | R7e(5) | R7f(6) | G7g(7) | G7h(8) | → Selected as phase difference row |
| 8 | G8a(9) | G8b(10) | B8c(11) | B8d(12) | G8e(13) | G8f(14) | B8g(15) | B8h(16) | → Selected as phase difference row |
| 9 | R9a | R9b | G9c | G9d | R9e | R9f | G9g | G9h | → Not selected |
| 10 | G10a | G10b | B10c | B10d | G10e | G10f | B10g | B10h | → Not selected |
| 11 | R11a | R11b | G11c | G11d | R11e | R11f | G11g | G11h | → Not selected |
| 12 | G12a | G12b | B12c | B12d | G12e | G12f | B12g | B12h | → Not selected |
| 13 | R13a | R13b | G13c | G13d | R13e | R13f | G13g | G13h | → Not selected |
| 14 | G14a | G14b | B14c | B14d | G14e | G14f | B14g | B14h | → Not selected |
| 15 | R15a | R15b | G15c | G15d | R15e | R15f | G15g | G15h | → Not selected |
| 16 | G16a | G16b | B16c | B16d | G16e | G16f | B16g | B16h | → Not selected |

Output order of image sensor signals

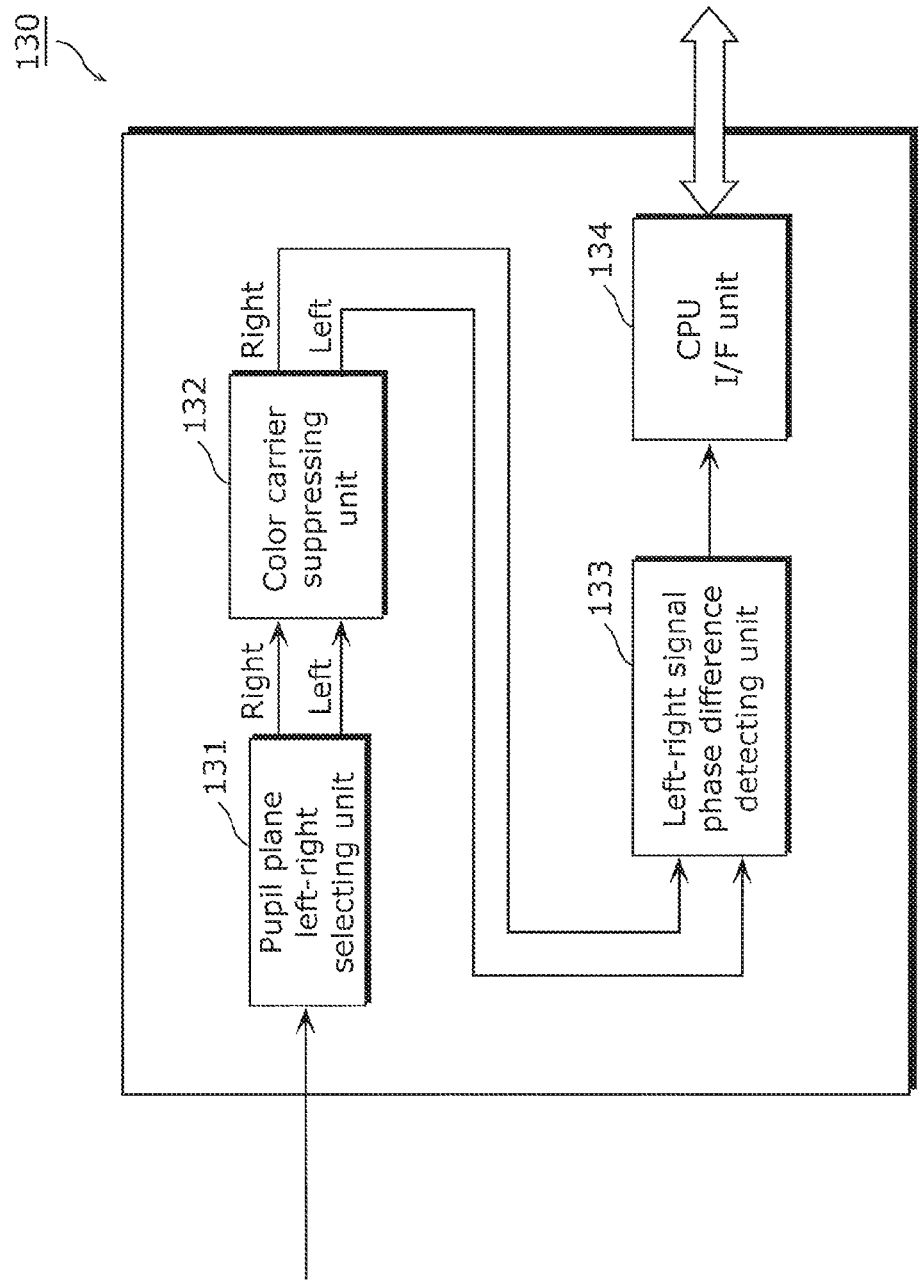

FIG. 11

| Column Row | a | b | c | d | e | f | g | h | |
|---|---|---|---|---|---|---|---|---|---|
| 1 | R1a ⊕ | R1b | R1c ⊕ | R1d | R1e ⊕ | R1f | R1g ⊕ | G1h | → Selected as main image row |
| 2 | G2a ⊕ | G2b | B2c ⊕ | B2d | G2e ⊕ | G2f | B2g ⊕ | B2h | → Selected as main image row |
| 3 | R3a ⊕ | R3b | G3c ⊕ | G3d | R3e ⊕ | R3f | G3g ⊕ | G3h | → Selected as main image row |
| 4 | G4a ⊕ | G4b | B4c ⊕ | B4d | G4e ⊕ | G4f | B4g ⊕ | B4h | → Selected as main image row |
| 5 | R5a ⊕ | R5b | G5c ⊕ | G5d | R5e ⊕ | R5f | G5g ⊕ | G5h | → Selected as main image row |
| 6 | G6a ⊕ | G6b | B6c ⊕ | B6d | G6e ⊕ | G6f | B6g ⊕ | B6h | → Selected as main image row |
| 7 | R7a ⊕ | R7b | G7c ⊕ | G7d | R7e ⊕ | R7f | G7g ⊕ | G7h | → Selected as main image row |
| 8 | G8a ⊕ | G8b | B8c ⊕ | B8d | G8e ⊕ | G8f | B8g ⊕ | B8h | → Selected as main image row |
| 9 | R9a ⊕ | R9b | G9c ⊕ | G9d | R9e ⊕ | R9f | G9g ⊕ | G9h | → Selected as main image row |
| 10 | G10a ⊕ | G10b | B10c ⊕ | B10d | G10e ⊕ | G10f | B10g ⊕ | B10h | → Selected as main image row |
| 11 | R11a ⊕ | R11b | G11c ⊕ | G11d | R11e ⊕ | R11f | G11g ⊕ | G11h | → Selected as main image row |
| 12 | G12a ⊕ | G12b | B12c ⊕ | B12d | G12e ⊕ | G12f | B12g ⊕ | B12h | → Selected as main image row |
| 13 | R13a ⊕ | R13b | G13c ⊕ | G13d | R13e ⊕ | R13f | G13g ⊕ | G13h | → Selected as main image row |
| 14 | G14a ⊕ | G14b | B14c ⊕ | B14d | G14e ⊕ | G14f | B14g ⊕ | B14h | → Selected as main image row |
| 15 | R15a ⊕ | R15b | G15c ⊕ | G15d | R15e ⊕ | R15f | G15g ⊕ | G15h | → Selected as main image row |
| 16 | G16a ⊕ | G16b | B16c ⊕ | B16d | G16e ⊕ | G16f | B16g ⊕ | B16h | → Selected as main image row |

⊕ Addition within image sensor

IMAGING APPARATUS AND SOLID-STATE IMAGING DEVICE

CROSS REFERENCE TO RELATED APPLICATION

This is a continuation application of PCT International Application No. PCT/JP2013/007652 filed on Dec. 26, 2013, designating the United States of America, which is based on and claims priority of Japanese Patent Application No. 2013-016062 filed on Jan. 30, 2013. The entire disclosures of the above-identified application, including the specifications, drawings and claims are incorporated herein by reference in their entirety.

FIELD

One or more exemplary embodiments disclosed herein relate generally to an imaging apparatus and a solid-state imaging device included in the imaging apparatus.

BACKGROUND

Recent imaging apparatuses such as digital cameras have a focus detection function, and apparatuses with an autofocus (AF) function are widely used. The known focus detection methods include contrast AF and phase difference AF. In the contrast AF, a focal point at which a high-frequency component of an image signal peaks in intensity is detected. In the phase difference AF, two images with a phase difference horizontally (or vertically) occurring according to a degree of defocus are obtained, and the focal point is calculated based on the phase difference. Here, the phase difference is a distance between these images.

In the contrast AF, the peak in high-frequency component of an image signal is searched for while the focus lens is being moved. Thus, the contrast AF has a problem that it takes time to detect a focal point in the significant defocus state.

Here, PTL 1 discloses a conventional imaging apparatus (digital camera) that applies an image-plane phase difference AF using an image sensor for capturing main images, with the same principle as that of the phase difference AF that is used in single-lens reflex cameras. More specifically, one pixel of a solid-state imaging device (image sensor) includes a microlens and two light receiving units for a single color filter. One picture element consisting of pixels includes at least one pixel having a different arrangement of light receiving units. With the structure, the focal point can be detected using beams having different pupil dividing directions through an optical lens, and whether to add the output of light receiving units within one pixel or not can be selected. For example, in a structure where a signal can be output to the same frame within one pixel, first, the non-addition is selected to perform AF shooting with the image-plane phase difference detection. Then, the lens is focused based on information of the detection result, and addition is selected to capture the image for recording.

CITATION LIST

Patent Literature

[PTL 1] Japanese Unexamined Patent Application Publication No. 2007-65330

SUMMARY

Technical Problem

The conventional solid-state imaging device and imaging apparatus disclosed in PTL 1 can avoid image degradation in a main image, by performing the AF shooting for focusing and capturing an image for recording in a time division manner.

However, in the conventional technique, the number of output signals of the same frame in the same microlens, in an AF shooting frame is one. Thus, only a signal of a light receiving unit at a beam angle in a part of beam that passes through an exit pupil is output, and a signal of a light receiving unit that receives beam at a beam angle different from that of the beam that passes through the exit pupil, within the same microlens is lost. Accordingly, a problem occurs which the focus detection accuracy of the phase difference AF decreases.

Solution to Problem

In one general aspect, the techniques disclosed here feature an imaging apparatus including: an optical lens that optically forms an image of light from an object; a plurality of light receiving units two-dimensionally arranged on a substrate, and each configured to receive the light that has passed through the optical lens, convert the light into a photoelectric conversion signal, and read the photoelectric conversion signal in a non-destructive readout mode; a plurality of microlenses each placed (i) for every two or more adjacent light receiving units among the light receiving units and (ii) above the two or more adjacent light receiving units; a signal generating unit configured to read the photoelectric conversion signal from each of the light receiving units, and generate (i) a full-addition signal by adding all of the photoelectric conversion signals obtained in a predetermined frame by the two or more adjacent light receiving units corresponding to one of the microlenses, (ii) a partial addition signal by adding the photoelectric conversion signals obtained by at least one but not all of the two or more adjacent light receiving units, and (iii) non-addition independent signals that are the photoelectric conversion signals of one of the light receiving units; a phase difference detecting unit configured to detect a focal point from the partial addition signal and the non-addition independent signals, based on a phase difference between the two or more adjacent light receiving units; and a YC processing unit configured to generate a main image from the full-addition signal.

General and specific aspects disclosed above may be implemented not only as an imaging apparatus having such characteristic units but also as a solid-state imaging device included in the imaging apparatus.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 8 conceptually illustrates a procedure for outputting image sensor signals in the AF shooting mode according to Embodiment 1.

FIG. 9 is a block diagram illustrating a configuration of the phase difference detecting unit included in the imaging apparatus according to Embodiment 1.

FIG. 11 conceptually illustrates a procedure for outputting image sensor signals in the main image capturing mode according to Embodiment 1.

FIG. 21 conceptually illustrates a procedure for outputting image sensor signals in capturing main images in AF mode according to Embodiment 2.

FIG. 25 conceptually illustrates output of main-image raw data signals by the adding unit in capturing main images in AF mode according to Embodiment 2.

DESCRIPTION OF EMBODIMENTS

The following will be described with reference to the drawings. In Embodiments, an image sensor (solid-state imaging device) including photoelectric conversion elements (photoconductive films) on a semiconductor substrate, not within a semiconductor substrate, is called a stacked image sensor.

Each of the exemplary embodiments described below shows a general or specific example. The numerical values, shapes, materials, structural elements, the arrangement and connection of the structural elements, steps, the processing order of the steps etc. shown in the following exemplary embodiments are mere examples, and therefore do not limit the scope of the appended Claims and their equivalents. Therefore, among the structural elements in the following exemplary embodiments, structural elements not recited in any one of the independent claims are described as arbitrary structural elements.

Embodiment 1

Structure of Image Sensor

Figure 1:
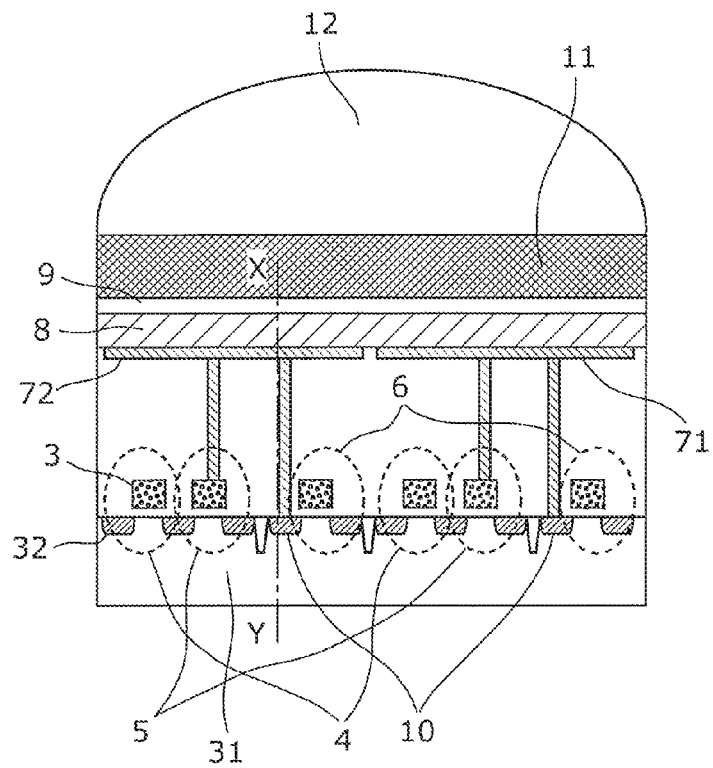
FIG. 1 schematically illustrates a cross-section structure of a unit pixel cell of an image sensor included in an imaging apparatus according to Embodiment 1.

FIG. 1 schematically illustrates a cross-section structure of a unit pixel cell of an image sensor included in an imaging apparatus according to Embodiment 1. The unit pixel cell in FIG. 1 includes two light receiving units, a microlens 12, and two light receiving electrodes 71 and 72 that are horizontally arranged. Two groups of transistors form a light receiving circuit above a p-type silicon substrate 31. The group includes an address transistor 4, an amplifying transistor 5, and a reset transistor 6 each including an n-type source-drain diffusion layer 32 and a gate electrode 3. Above the light receiving circuit including the two groups of transistors, the light receiving electrodes 71 and 72, a photoconductive film 8, a transparent electrode 9, a color filter 11, and a microlens 12 are stacked. Each of the light receiving electrodes 71 and 72 is connected to the gate electrode 3 of the amplifying transistor 5, and the n-type source-drain diffusion layer 32 of the reset transistor 6. The n-type source-drain diffusion layer 32 connected to one of the light receiving electrodes 71 and 72 is called a storage diode 10. Furthermore, the shape of the light receiving units is determined by the shape of the light receiving electrodes 71 and 72. The light receiving units according to Embodiment 1 are two-dimensionally arranged on the p-type silicon substrate 31, and receive light from an object, and convert it into a photoelectric conversion signal. One of the two light receiving units included in the unit pixel cell includes the light receiving electrode 71, the photoconductive film 8, the transparent electrode 9, the color filter 11, and the microlens 12. The other of the two light receiving units includes the light receiving electrode 72, the photoconductive film 8, the transparent electrode 9, the color filter 11, and the microlens 12. Furthermore, the photoconductive film 8 located above the p-type silicon substrate 31 and under the microlens 12 can individually read a photoelectric conversion signal in a non-destructive readout mode.

Although the conductive type of the silicon substrate is p-type and the conductive type of the transistors is n-channel type in Embodiment 1, the conductive type of the silicon substrate may be n-type and the conductive type of the transistors may be p-channel type. In this case, the sign of a voltage potential will be opposite in the following description.

Figure 2:
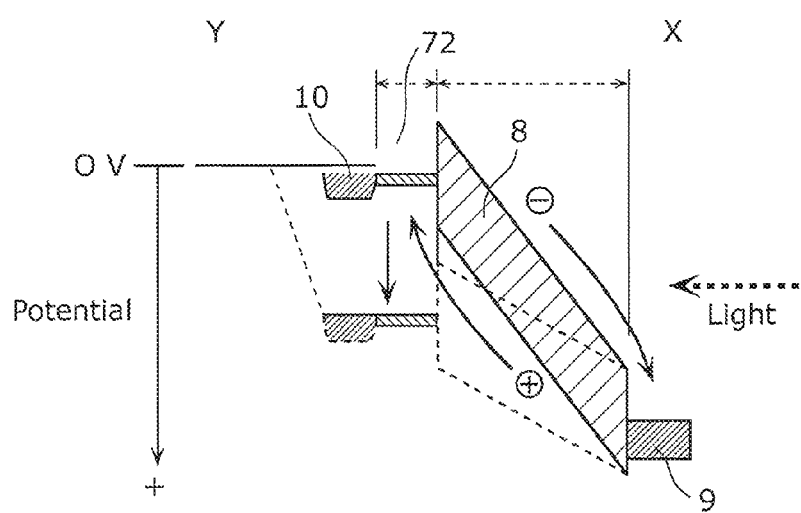
FIG. 2 conceptually illustrates a potential along with the X-Y line in FIG. 1.

FIG. 2 conceptually illustrates a potential along with the X-Y line in FIG. 1. A positive voltage is applied to the transparent electrode 9. The photoconductive film 8 converts, into electron-hole pairs, the light entering upward from and passing through the transparent electrode 9 to the photoconductive film 8. The electrons included in the resulting electron-hole pairs are carried to the transparent electrode 9, and flow through a transparent electrode power supply (not illustrated) connected to the transparent electrode 9. The holes are carried to the storage diodes 10, and are stored in the storage diodes 10. The potential of the storage diodes 10 is changed to positive.

The voltage changed to a positive by the holes stored in the storage diodes 10 is transmitted to the gate electrodes 3 of the amplifying transistors 5. The signal amplified by the amplifying transistors 5 passes through the address transistors 4 to be output outside of the pixel cell. Then, the signal charge stored in the storage diodes 10 is discharged by turning ON the reset transistors 6. Unless the reset transistors 6 are turned ON and as long as light enters the light receiving units, the signal charge continues to be stored in the storage diodes 10, thus implementing the non-destructive readout.

Figure 3:
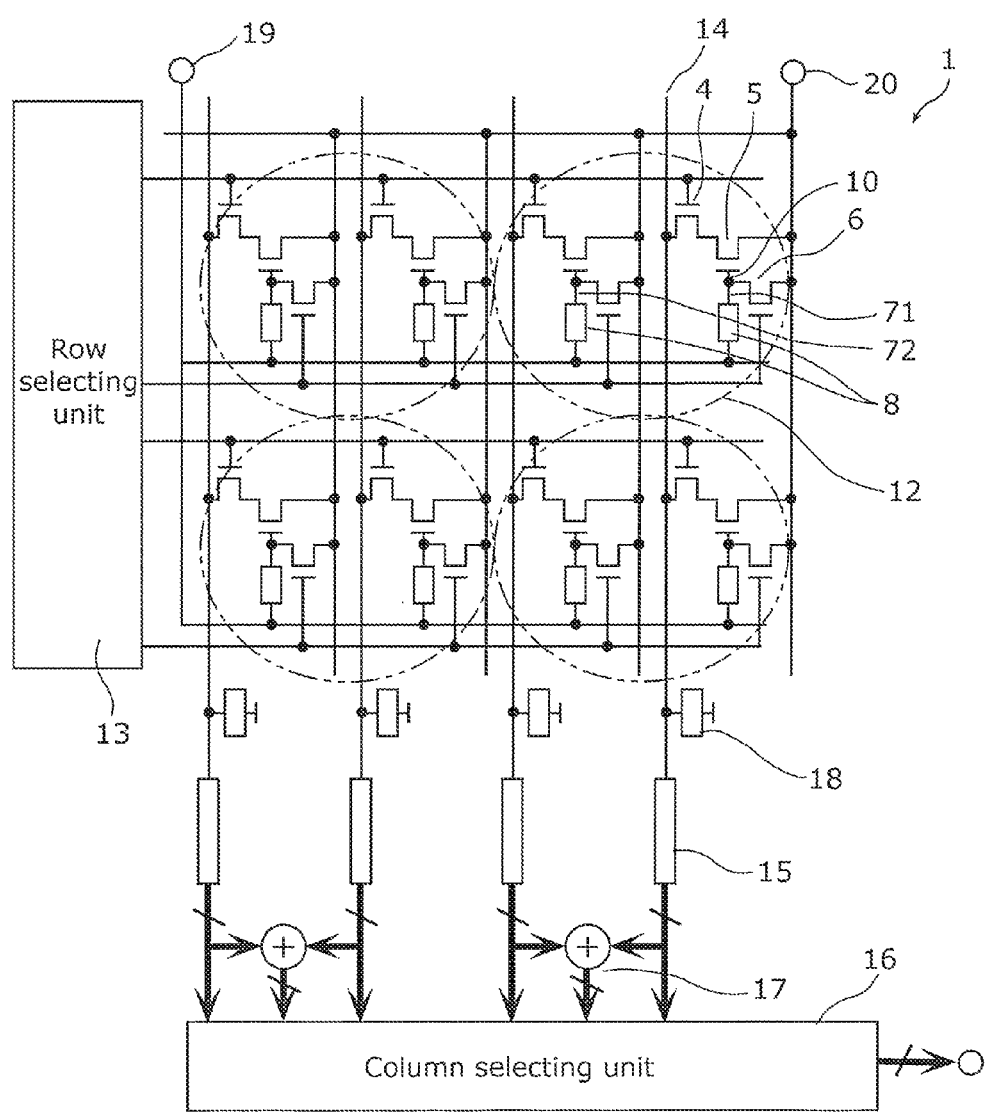
FIG. 3 is a circuit diagram of an image sensor according to Embodiment 1.

FIG. 3 is a schematic circuit diagram of an image sensor 1 according to Embodiment 1. The image sensor 1 in FIG. 3 is a solid-state imaging device including: unit pixel cells arranged in a matrix (each of the unit pixel cells has the structure illustrated in FIG. 1); load units 18 and A/D converters 15 that are connected to vertical signal lines 14 each of which is arranged for each column; adding units 17 each of which adds output signals of adjacent vertical signal lines; a row selecting unit 13; and a column selecting unit 16.

Although not illustrated in FIG. 3, color filters are actually arranged above the unit pixel cells. The arrangement of the color filters will be described later. Furthermore, although the photoconductive films 8 are uniformly stacked over the photoconductive area, the photoconductive film 8 is arranged for each of the light receiving electrodes in FIG. 3.

[Basic Operations of Image Sensor]

The basic operations of the image sensor 1 in the imaging apparatus according to Embodiment 1 will be described below.

In FIG. 3, each of the storage diodes 10 converts, into a voltage, the signal charge obtained through the photo conversion by the photoconductive film 8 in the row selected by the row selecting unit 13. Then, the amplifying transistor 5 amplifies the voltage converted by the storage diode 10, and outputs the voltage as a voltage signal to the vertical signal line 14 through the address transistor 4. The A/D converter 15 converts the voltage signal into a digital signal.

Next, if necessary, the adding unit 17 adds signal values of the two light receiving units arranged in the microlens 12. Then, the column selecting unit 16 sequentially selects and outputs one of an addition signal and a non-addition independent signal obtained by the adding unit 17, in a horizontal scanning direction. The detailed operation sequence will be described later.

The column selecting unit 16 is a selection circuit that selectively controls orders of reading the photoelectric conversion signals from the light receiving units.

The amplifying transistor 5 and the load unit 18 form a source follower circuit. A transparent electrode power supply 19 applies the same voltage to the photoconductive films 8 in all the light receiving units. A source follower power supply 20 applies the same source follower supply voltage to the amplifying transistors 5 in all the light receiving units.

After output of the voltage signal, the signal charge stored in the storage diodes 10 in the light receiving units is discharged by turning ON the reset transistors 6 if necessary. This reset operation immediately after outputting the signal is a destructive reading operation.

Figure 4:
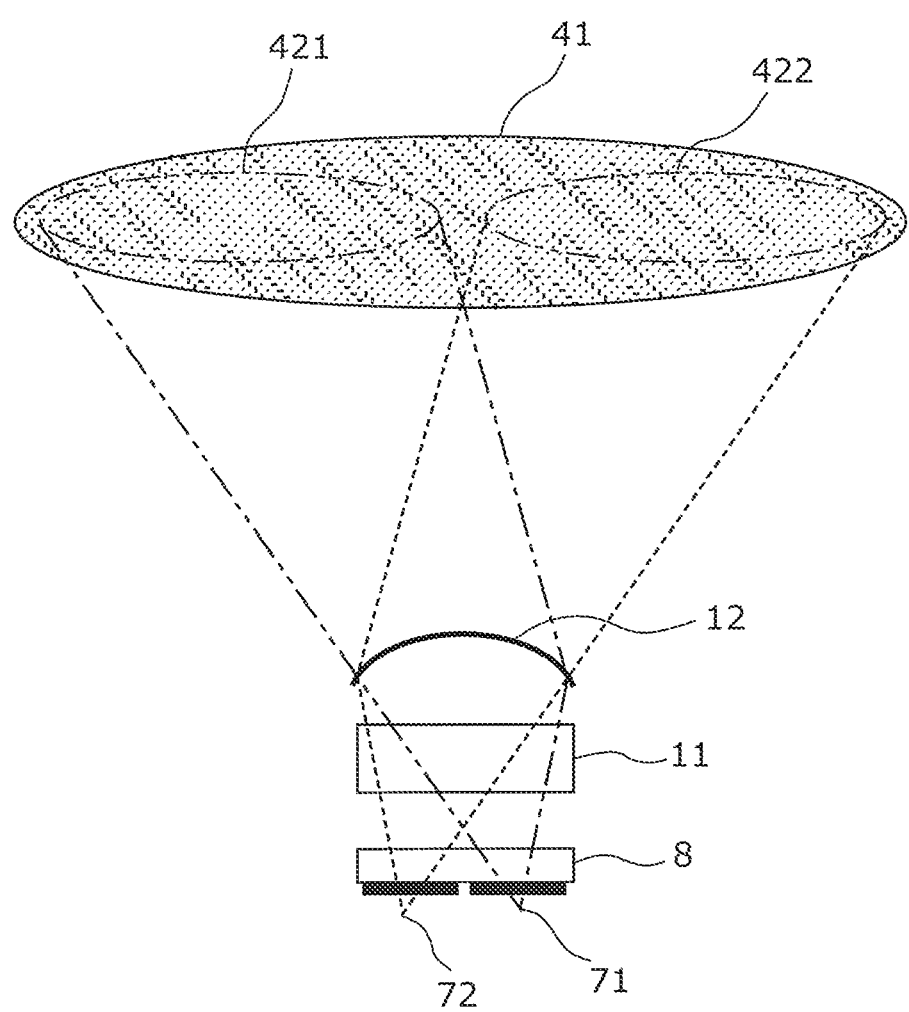
FIG. 4 cross-sectionally illustrates a pupil plane toward a microlens for light receiving units in the image sensor according to Embodiment 1.

FIG. 4 cross-sectionally illustrates the pupil plane of an optical lens toward the microlens for the light receiving units in the image sensor according to Embodiment 1. Oppositely tracing the light entering the photoconductive film 8 above the light receiving electrodes 71 and 72 from the light receiving side, the light passes through the color filter 11, is refracted by the microlens 12, and passes through pupil plane areas 421 and 422 separated from a lens pupil plane 41.

The light corresponding to the charge signal detected by the light receiving electrode 71 passes through the pupil plane area 421, and the light corresponding to the charge signal detected by the light receiving electrode 72 passes through the pupil plane area 422. Then, the charge signals detected by the light receiving electrodes 71 and 72 are compared in signal level. Accordingly, the phase difference component corresponding to the degree of defocus in an optical image can be detected.

Furthermore, addition of the signal levels of the charge signals of the light receiving electrodes 71 and 72 results in a signal almost equivalent to the beam that passes through the lens pupil plane 41.

Figure 5:
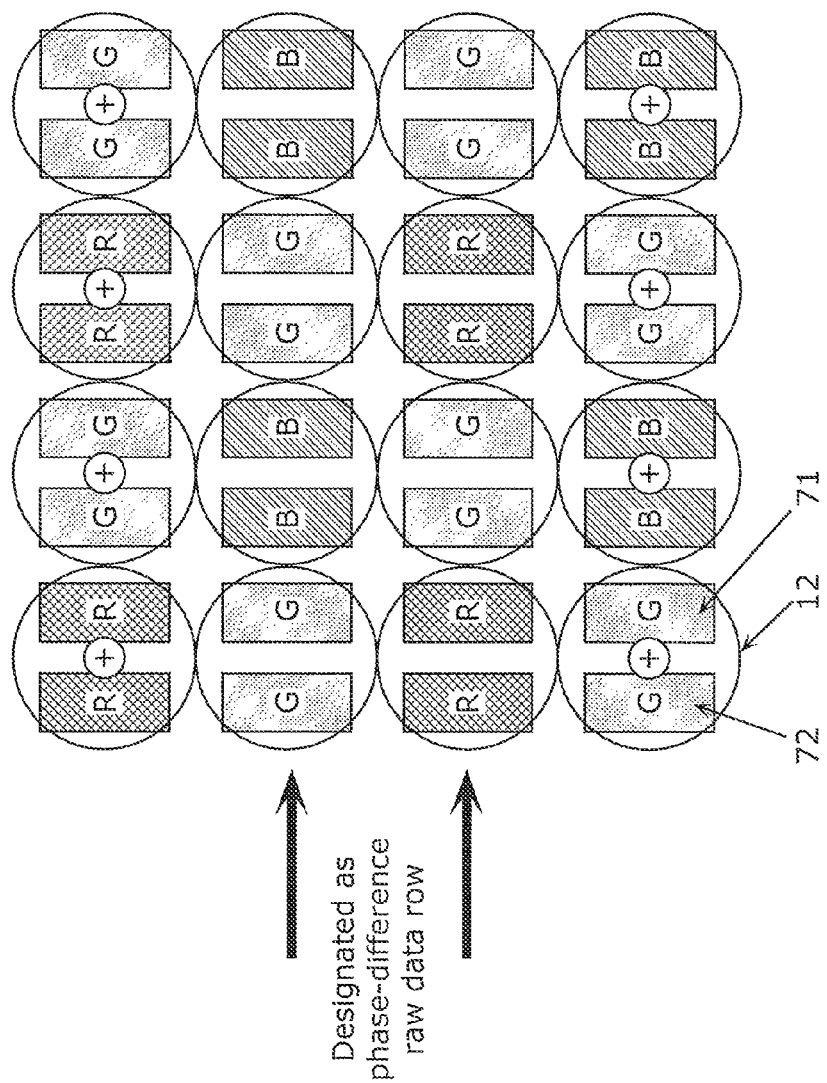
FIG. 5 is a top plane view schematically illustrating a color filter array of the image sensor according to Embodiment 1.

FIG. 5 is a top plane view schematically illustrating a color filter array of the image sensor according to Embodiment 1. As illustrated in FIG. 5, the microlens 12 is placed for every two of the light receiving units that are adjacent to each other, and is placed above the two light receiving units. Furthermore, the microlens 12 is of the same color, and four microlenses that are two horizontal and two vertical microlenses form a color filter of an RGB Bayer array as one unit.

Although the color filters formed in the microlens 12 are seamlessly formed without being separated in actual situation, they are separated to correspond to the light receiving electrodes 71 and 72 in FIG. 5 for convenience.

The adding unit 17 horizontally adds the signals of the two light receiving units, in the unit pixel cells belonging to a row designated as a main-image raw data output row. Then, the image sensor outputs the resulting signal. In contrast, the image sensor independently outputs the signals of the two light receiving units, in the unit pixel cells belonging to a row designated as a phase-difference raw data output row, without using the adding unit 17.

In other words, the image sensor 1 includes a signal generating unit configured to read the photoelectric conversion signal from each of the light receiving units, and generate (i) a full-addition signal by adding all of the photoelectric conversion signals obtained in a predetermined frame by the two or more adjacent light receiving units corresponding to one of the microlenses 12, and (ii) non-addition independent signals that are the photoelectric conversion signals of one of the light receiving units. The signal generating unit includes the adding unit 17. Furthermore, the image sensor 1 includes the light receiving units, the microlens 12, the signal generating unit, and the selecting circuit.

Here, when a row is designated for the two light receiving units corresponding to the microlens 12 as light receiving units that should generate the non-addition independent signals, the two light receiving units are horizontally arranged (in a direction where the row is extended), and the signal generating unit is configured to horizontally add the photoelectric conversion signals obtained by the light receiving units belonging to the designated row. Here, when a column is designated for the two light receiving units corresponding to the microlens 12 as light receiving units that should generate the non-addition independent signals, the two light receiving units are vertically arranged (in a direction where the column is extended), and the signal generating unit is configured to vertically add the photoelectric conversion signals obtained by the light receiving units belonging to the designated column.

[Single-Shooting Still Images by Imaging Apparatus]

Next, the details of single-shooting still images by the imaging apparatus according to Embodiment 1 will be described.

Figure 6:
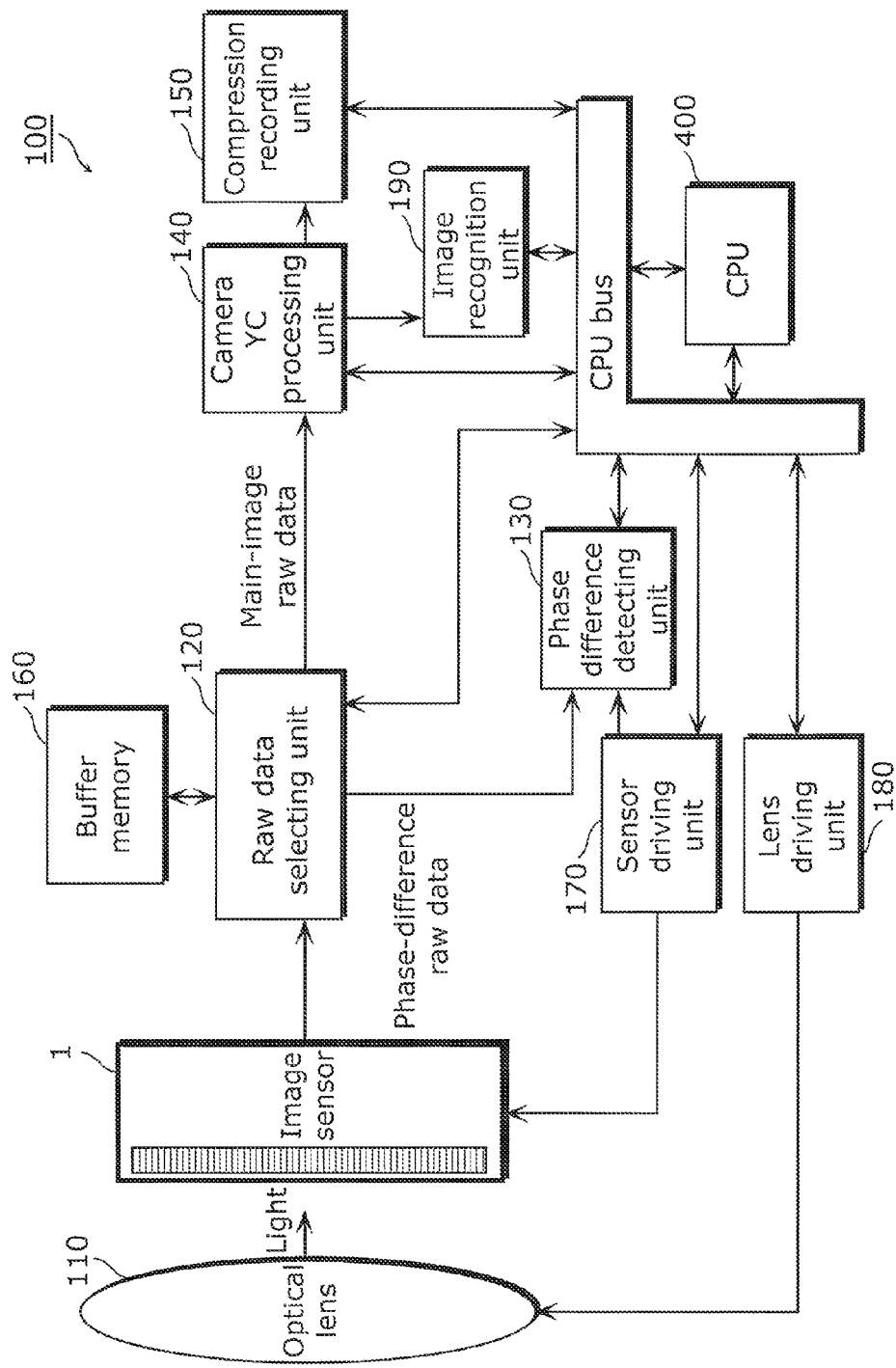
FIG. 6 is a block diagram illustrating a configuration of an imaging apparatus according to Embodiment 1.
Figure 7:
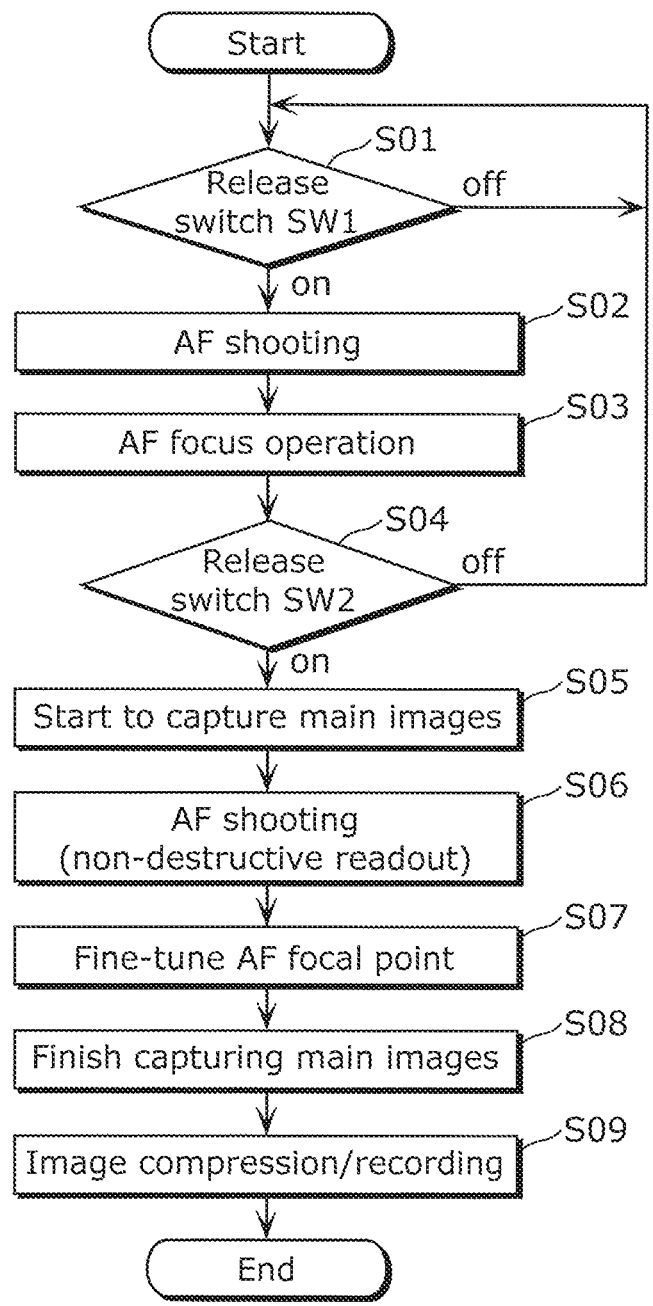
FIG. 7 is an operation flowchart in single-shooting still images by the imaging apparatus according to Embodiment 1.

FIG. 6 is a block diagram illustrating a configuration of an imaging apparatus 100 according to Embodiment 1. Furthermore, FIG. 7 is an operation flowchart in single-shooting still images by the imaging apparatus 100 according to Embodiment 1. The imaging apparatus 100 in FIG. 6 includes the image sensor 1, an optical lens 110 that optically forms an image of light from an object, a raw data selecting unit 120, a phase difference detecting unit 130, a camera YC processing unit 140, a compression recording unit 150, a buffer memory 160, a sensor driving unit 170 that sets the output timing of an addition signal and a non-addition independent signal per row or column, a lens driving unit 180, an image recognition unit 190, and a CPU 400. In other words, the imaging apparatus 100 includes the image sensor 1, and a signal processing circuit that processes a pixel signal output from the image sensor 1. The image sensor 1 includes the light receiving units, the selecting circuit, and the signal generating unit. Furthermore, the signal processing circuit includes the phase difference detecting unit 130 and the camera YC processing unit 140.

First, the sequence of single-shooting still images by the imaging apparatus 100 with the structure will be described.

As indicated in FIG. 7, a release switch SW1 is turned ON, such as half-depressing a shutter button, during the startup in the still image capturing mode (S01). Accordingly, an AF shooting mode starts (S02). In the AF shooting mode, rows are selected by two rows from among part of all the rows. The signals corresponding to the optical image formed by the light receiving units using the pupil segmentation on the image sensor 1 through the optical lens 110, in the unit pixel cells belonging to the selected row are independently output from the image sensor 1 as phase-difference raw data output signals without using the adding unit 17. The procedure for outputting the phase-difference raw data in the AF shooting mode will be specifically described with reference to FIG. 8.

FIG. 8 conceptually illustrates a procedure for outputting image sensor signals in the AF shooting mode according to Embodiment 1. In FIG. 8, the smallest area enclosed by the solid line represents one light receiving unit, and the encircled numbers to the right of the light receiving units represent an order of outputting the signals generated by the light receiving units from the image sensor 1. Furthermore, one square enclosed by the thick line represents the area to be processed by the microlens 12.

In the example of FIG. 8, only the seventh and eighth rows are selected as the phase difference rows. Thus, the first to sixth rows and ninth to 16th rows are neither selected nor read. The signals R7a, R7b, G7c, G7d, R7e, R7f, G7g, and G7h for the seventh row, and the signals G8a, G8b, B8c, Bbd, G8e, G8f, B8g, and B8h for the eighth row are individually output from the image sensor 1. The number of actual read rows in the AF shooting mode is approximately 20 rows in one screen, and there is no practical problem in the prolonged output operation period. The CPU 400 causes the sensor driving unit 170 to arbitrarily set an assignment address for assigning a phase difference row from which the phase-difference raw data output signal is read, by two rows. Here, the phase-difference raw data output signal does not have to be read in a non-destructive readout mode.

Back to FIGS. 6 and 7, the operation of the imaging apparatus 100 will be continuously described.

The raw data selecting unit 120 selects the phase-difference raw data output signal output from the image sensor 1. Then, the phase difference detecting unit 130 receives the signal, and detects the focal point thereof. Here, the configuration of the phase difference detecting unit 130 will be described.

FIG. 9 is a block diagram illustrating a configuration of the phase difference detecting unit 130 included in the imaging apparatus according to Embodiment 1. The phase difference detecting unit 130 in FIG. 9 includes a pupil plane left-right selecting unit 131, a color carrier suppressing unit 132, a left-right signal phase difference detecting unit 133, and a CPU I/F unit 134. In the phase difference detecting unit 130, the pupil plane left-right selecting unit 131 selectively separates signals corresponding to the left and right pupil planes, the color carrier suppressing unit 132 performs LPF processing to remove the color carrier, and the left-right signal phase difference detecting unit 133 detects a phase shift between the left and right signals. The phase difference detecting unit 130 communicates with the CPU 400 via the CPU I/F unit 134 on the CPU bus, based on the result of detection. In other words, the phase difference detecting unit 130 detects a focal point from a partial addition signal and non-addition independent signals, based on a phase difference between the adjacent two light receiving units. The sequence of detecting the phase shift by the phase difference detecting unit 130 will be specifically described with reference to FIG. 10.

Figure 10:
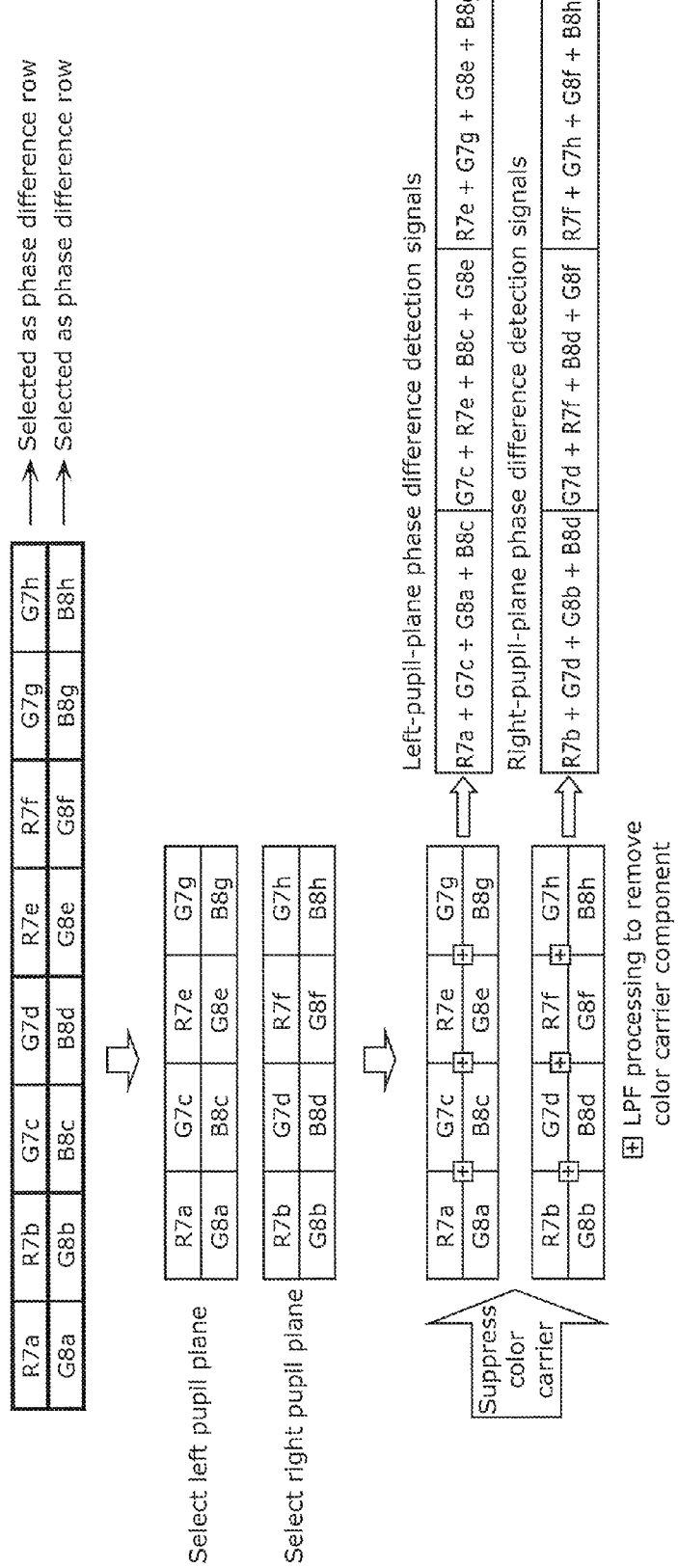
FIG. 10 conceptually illustrates operations of the phase difference detecting unit according to Embodiment 1 in detail.

FIG. 10 conceptually illustrates operations of the phase difference detecting unit according to Embodiment 1 in detail. As illustrated in FIG. 10, left and right pupil plane signals are selectively separated from the unit pixel cells belonging to the row selected as a phase difference row. In other words, R7a, G7c, R7e, G7g, G8a, B8c, G8e, and B8g are selected as left pupil plane signals, and R7b, G7d, R7f, G7h, G8b, Bbd, G8f, and B8h are selected as right pupil plane signals. Then, to suppress the color carrier in the signals, the left and right RGB Bayer array signals (for example, R7a, G7c, G8a, and B8c) are added to obtain the phase difference detection signal for each of the left and right pupil planes. In FIG. 10, three left-pupil-plane phase difference detection signals and three right-pupil-plane phase difference detection signal are generated.

Since the phase difference AF rows are selected by two rows, the RG rows and GB rows that are vertically adjacent are selected, thus enabling the high-accuracy phase difference detection using all the signals including the RGB components. Furthermore, since information on all the pixels is horizontally obtained, the phase difference can be detected from pixels at the horizontal Nyquist frequency.

Back to FIGS. 6 and 7 again, the operation of the imaging apparatus 100 will be continuously described.

The CPU 400 that obtains information on the result of phase difference detection performs a distance calculation, and temporarily completes the AF focus operation by causing the lens driving unit 180 to move the focus lens of the optical lens 110 to an appropriate position (S03).

Next, a release switch SW2 is turned ON, such as depressing the shutter button fully (S04). Accordingly, still images for the main images start to be captured (S05). Here, at the beginning of the period for storing the captured main image, the reset operation of the image sensor is stopped, and the operation as same as that in the AF shooting mode is performed in the non-destructive readout mode (S06). If necessary, the focus motor is fine-tuned based on the result of phase difference detection of the obtained main image, that is, the AF focal point is fine-tuned (S07).

Next, at the end of or after the period for storing the captured main image, the main image is read. Specifically, each of the light receiving units separated to the left and right by the optical lens pupil plane in the microlens 12 detects a signal. Then, the adding unit 17 adds the signals, and the image sensor 1 outputs the resulting signal to read the main image.

Generating main image data in the main image capturing mode will be specifically described with reference to FIG. 11.

FIG. 11 conceptually illustrates a procedure for outputting image sensor signals in the main image capturing mode according to Embodiment 1. In FIG. 11, the encircled + sign indicates adding signals in the image sensor 1, and the shaded area enclosed by the solid line corresponds to a light receiving unit that outputs the signal. For example, in the first row and the a-th column and the first row and the b-th column, the signal R1a and the signal R1b are added in the image sensor 1, and the light receiving unit in the first row and the b-th column whose output order is originally later outputs the resulting addition signal. In the following drawings, the encircled + sign and the shading areas are used in the same manner.

As indicated in FIG. 11, signals in the main image capturing mode are uniformly output from the entire screen, and the output is equivalent to a general RGB Bayer array in which a microlens is defined as a pixel. Here, the main image capturing mode is finished (S08).

The following operations of the imaging apparatus 100 are basically the same as those of a digital camera with a general RGB Bayer array. More specifically, the raw data selecting unit 120 selects the main-image raw data output as a main image. Then, the compression recording unit 150 compresses the image in JPEG or others through the camera YC processing unit 140. Thus, the data is recorded in a medium, completing the still image capturing operation (S09). Here, the camera YC processing unit 140 is a YC processing unit configured to generate a main image from the full-addition signal.

In other words, in the single-shooting still images by the imaging apparatus 100, the signal generating unit in the image sensor 1 outputs non-addition independent signals to the phase difference detecting unit 130 through the raw data selecting unit 120 in a non-destructive readout mode at the beginning of a charge storage period in which the charge generated by the light received by each of the light receiving units is continuously stored without being reset. Furthermore, at the end of and after the charge storage period, the full-addition signals are output to the camera YC processing unit 140 through the raw data selecting unit 120.

With the operations of the imaging apparatus 100, the phase difference signals of the light receiving units separated individually to the left and right by the optical lens pupil plane are obtained. The light receiving units are included in all the unit pixel cells belonging to the phase difference AF row. Accordingly, the focal point of the phase difference AF can be detected from the high frequency signals in pixels at the Nyquist frequency, thus significantly increasing the focal point detection accuracy. Furthermore, all the RGB color components can be used for detecting a focal point, thus reducing the influence of the color of an object on the accuracy for detecting the focal point. Furthermore, the focal point can be detected during a period in which charge of the main image signal is stored in a non-destructive readout mode, thus increasing the reliability of AF against movement of the object.

[Still-Image Continuous Shooting by Imaging Apparatus]

Next, the operation of continuous-shooting still images by the imaging apparatus 100 will be described with reference to FIGS. 6 and 12.

Figure 12:
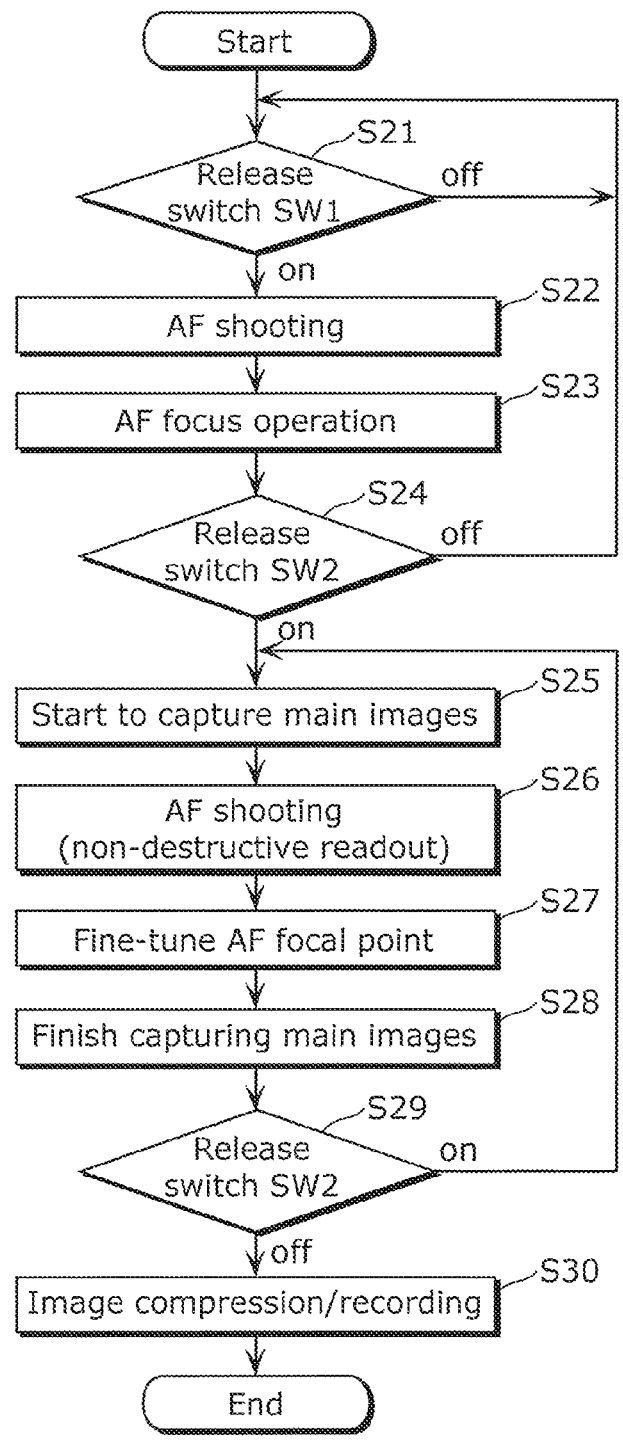
FIG. 12 is an operation flowchart in continuous-shooting still images by the imaging apparatus according to Embodiment 1.

FIG. 12 is an operation flowchart in continuous-shooting still images by the imaging apparatus according to Embodiment 1. The sequence of continuous-shooting still images by the imaging apparatus 100 will be described.

As indicated in FIG. 12, a release switch SW1 is turned ON, such as half-depressing the shutter button, during the startup in the still image capturing mode (S21). Accordingly, the AF shooting mode starts (S22). In the AF shooting mode, rows are selected by two rows from among part of all the rows. The signals corresponding to the optical image formed by the light receiving units using the pupil segmentation on the image sensor 1 through the optical lens 110, in the unit pixel cells belonging to the selected row are independently output from the image sensor 1 as phase-difference raw data output signals without using the adding unit 17. The detailed description on the output order of the phase-difference raw data in the AF shooting mode is the same as the single-shooting still images by the imaging apparatus 100 as indicated in FIG. 8. Thus, the description is omitted herein.

The raw data selecting unit 120 selects the phase-difference raw data output signal output from the image sensor 1. Then, the phase difference detecting unit 130 receives it, and detects the focal point.

The configuration of the phase difference detecting unit 130 is as illustrated in FIG. 9. The sequence of detecting the phase shift by the phase difference detecting unit 130 is as illustrated in FIG. 10, and as same as the single-shooting still images by the imaging apparatus 100. Thus, the description is omitted herein.

Next, the CPU 400 that obtains information on the result of phase difference detection performs a distance calculation, and temporarily completes the AF focus operation by causing the lens driving unit 180 to move the focus lens of the optical lens 110 to an appropriate position (S23).

Next, a release switch SW2 is turned ON, such as depressing the shutter button fully (S24). Accordingly, still images for the main images start to be captured (S25). Here, at the beginning of the period for storing the captured main image, the reset operation of an image sensor is stopped, and the operation as same as that in the AF shooting mode is performed in the non-destructive readout mode (S26). If necessary, the focus motor is fine-tuned based on the result of phase difference detection of the obtained main image, that is, the AF focal point is fine-tuned (S27).

Next, at the end of or after the period for storing the captured main image, the main image is read. Specifically, each of the light receiving units separated to the left and right by the optical lens pupil plane in the microlens 12 detects a signal. Then, the adding unit 17 adds the signals, and the image sensor 1 outputs the resulting signal to read the main image. The detailed description on generation of main image data in the main image capturing mode is the same as the single-shooting still images by the imaging apparatus 100 as illustrated in FIG. 11. Thus, the description is omitted herein. Here, the main image capturing mode is finished (S28).

Next, when the release switch SW2 continues to be turned ON (ON at S29), the read main-image raw data signal is stored in the buffer memory 160 and others. Then, the process is back to the start of capturing main images (S25), and the same operations are continued.

When the release switch SW2 is turned OFF, the following processes are successively performed on the main-image raw data signal stored in the buffer memory 160 (S30). The following operations are basically the same as those of a digital camera with a general Bayer array. More specifically, the raw data selecting unit 120 selects the main-image raw data output as a main image. Then, the compression recording unit 150 compresses the data in JPEG or others through the camera YC processing unit 140, and the data is recorded in a medium. At the completion of the processes on all the main image row data stored in the buffer memory 160, the still-image continuous shooting is completed.

These operations produce an effect in the still image single shooting, and the focal point can be detected during a period in which charge of the main image signal is stored in a non-destructive readout mode. Accordingly, in the high-speed continuous shooting in which the main images are continuously captured, still images can be continuously captured with the phase difference AF without any degradation in the main image.

Embodiment 2

Hereinafter, the structure and operations of an imaging apparatus and an image sensor included in the imaging apparatus according to Embodiment 2, mainly the differences from Embodiment 1 will be described with reference to the drawings.

Figure 13:
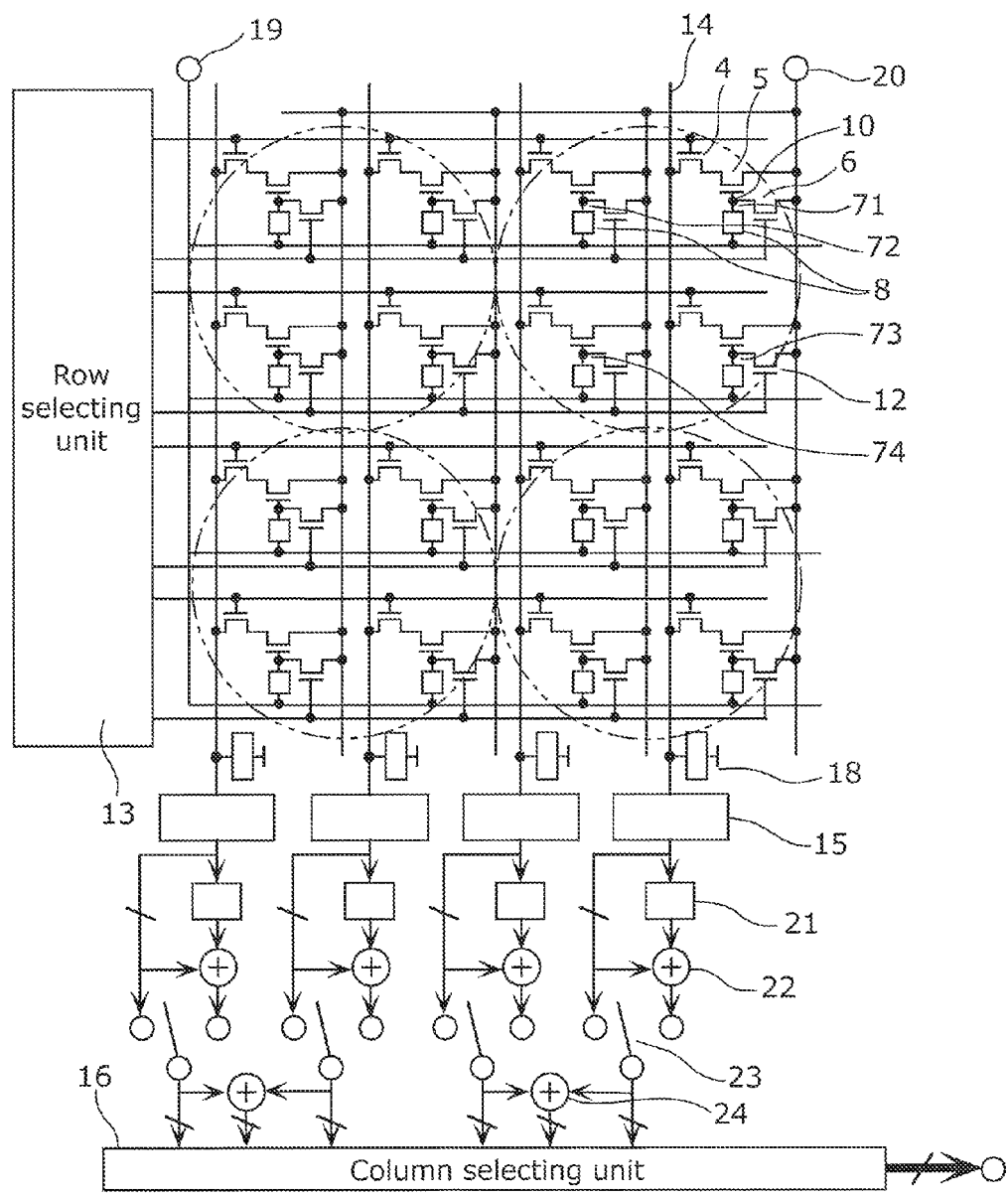
FIG. 13 is a circuit diagram of an image sensor according to Embodiment 2.

FIG. 13 is a circuit diagram of an image sensor 2 according to Embodiment 2. The image sensor 2 in FIG. 13 is a solid-state imaging device including unit pixel cells arranged in a matrix (each of the unit pixel cells has a structure illustrated in FIG. 1), load units 18 and A/D converters 15 that are connected to vertical signal lines 14 each of which is arranged for a column, buffer memories 21, vertical adding units 22, vertical addition signal selecting switches 23, horizontal adding units 24 each of which adds output signals from adjacent vertical signal lines, the row selecting unit 13, and the column selecting unit 16. Although the unit pixel cells according to Embodiment 2 are identical in the constituent elements to those according to Embodiment 1, they differ in the microlens 12 including four light receiving units. The four light receiving units are arranged for the light receiving electrodes 71, 72, 73, and 74, respectively. Although not illustrated in FIG. 13, color filters are actually arranged above the unit pixel cells. The arrangement of the color filters will be described later. Furthermore, although the photoconductive films 8 are uniformly stacked over the photoconductive area, each of the photoconductive films 8 is arranged for a corresponding one of the light receiving electrodes in FIG. 13.

[Basic Operations of Image Sensor]

The basic operations of the image sensor 2 in the imaging apparatus according to Embodiment 2 will be described below.

If necessary, the vertical adding unit 22 adds, among the four light receiving units horizontally and vertically separated in the microlens 12, signals of the two light receiving units separated in the vertical direction. Furthermore, when the signals are added, the buffer memory 21 temporarily holds signals in the preceding row.

Furthermore, the vertical addition signal selecting switch 23 selects one of the vertical addition signal and the vertical non-addition signals. Here, addition or non-addition is selected by two rows in a unit pixel cell for a microlens defined as one unit. Specifically, in a matrix in which the microlens 12 is defined as one unit, rows or columns are designated by two rows or two columns for the light receiving units that should generate the non-addition independent signals.

If further necessary, the horizontal adding unit 24 horizontally adds the signals from the light receiving units, within the microlens 12.

Then, the column selecting unit 16 selects one of the horizontal addition signal and the non-addition independent signals in a horizontal scanning direction by two columns independently from each matrix, and sequentially outputs the signals.

In other words, by selecting addition in both the horizontal and vertical directions, all the signals of the four light receiving units in the unit pixel cells are added. In other words, by selecting non-addition in both the horizontal and vertical directions, the signals of the four light receiving units in the unit pixel cells are independently output as four signals. The detailed operation sequence will be described later.

Figure 14:
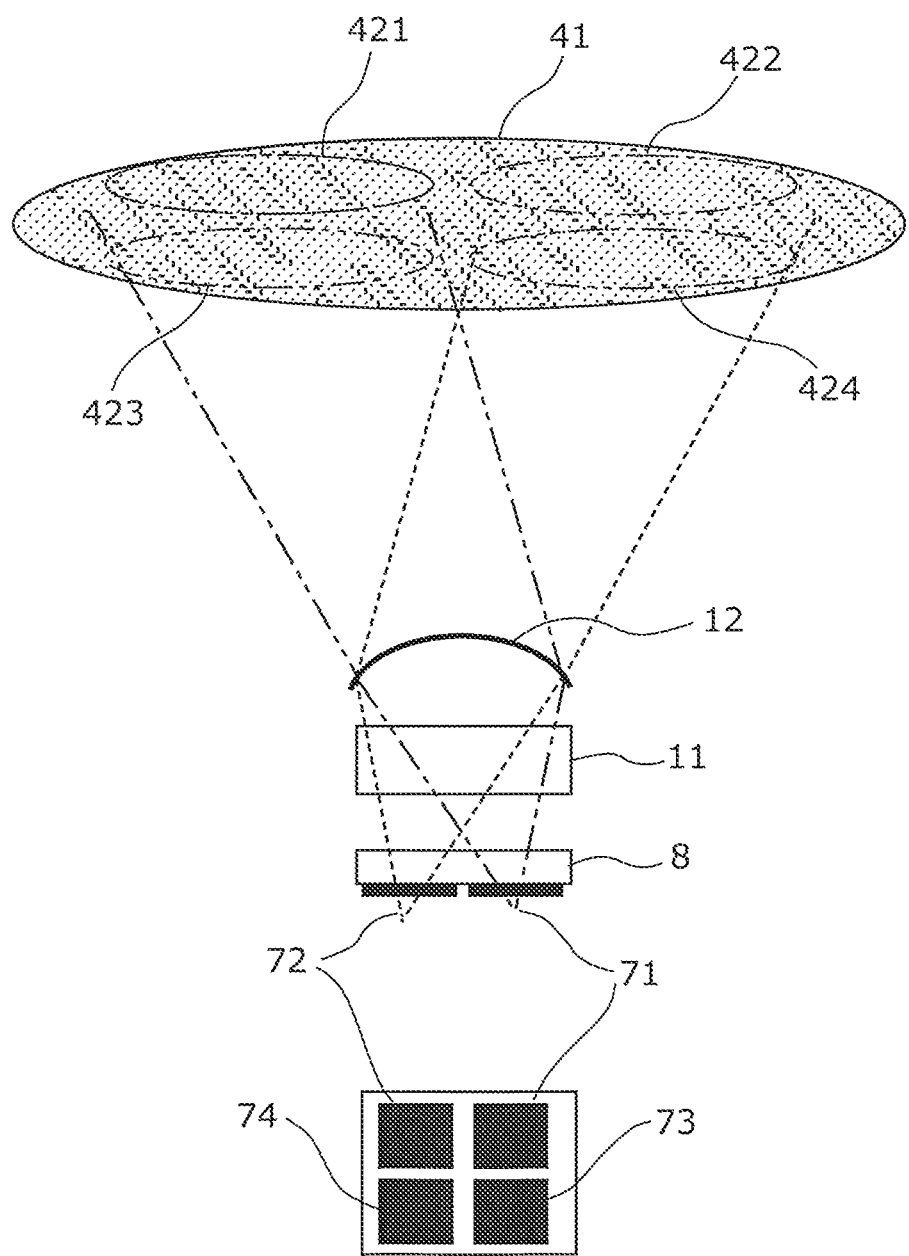
FIG. 14 cross-sectionally illustrates a pupil plane of an optical lens toward a microlens for light receiving units in the image sensor according to Embodiment 2.

FIG. 14 cross-sectionally illustrates the pupil plane of an optical lens toward the microlens for the light receiving units in the image sensor according to Embodiment 2. The following describes oppositely tracing, from the light receiving side, the light entering the photoconductive film 8 above (i) the upper-right light receiving electrode 71, (ii) the upper-left light receiving electrode 72, (iii) the lower-right light receiving electrode 73, and (iv) the lower-left light receiving electrode 74. In other words, the light entering the photoconductive film 8 above the light receiving electrodes 71, 72, 73, and 74 passes through the color filter 11, is refracted by the microlens 12, and passes through pupil plane areas 421, 422, 423, and 424, respectively, that are part of the lens pupil plane 41.

The light corresponding to the charge signal detected by the light receiving electrode 71 passes through the pupil plane area 421, and the light corresponding to the charge signal detected by the light receiving electrode 72 passes through the pupil plane area 422. Furthermore, the light corresponding to the charge signal detected by the light receiving electrode 73 passes through the pupil plane area 423, and the light corresponding to the charge signal detected by the light receiving electrode 74 passes through the pupil plane area 424. Comparison of the four light receiving electrodes in signal level in the horizontal and vertical directions enables detection of the phase difference components corresponding to the degree of defocus in an optical image in the horizontal and vertical directions.

Furthermore, addition of all the signal levels of the four light receiving electrodes results in a signal almost equivalent to the beam that passes entirely through the lens pupil plane 41.

Figure 15:
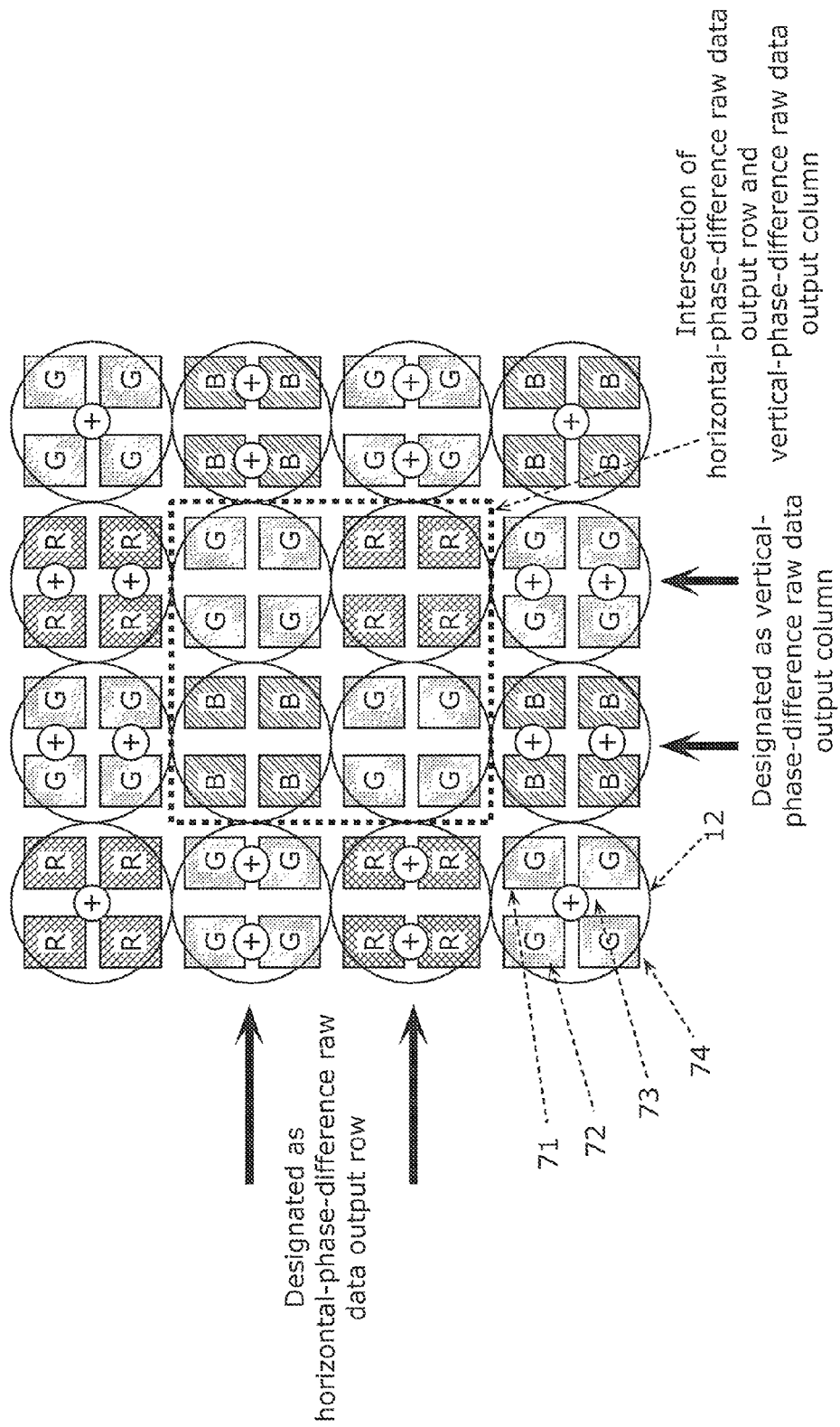
FIG. 15 is a top plane view schematically illustrating a color filter array of the image sensor according to Embodiment 2.

FIG. 15 is a top plane view illustrating a color filter array of the image sensor according to Embodiment 2. Each of the microlenses 12 is of the same color, and four microlenses that are two horizontal and two vertical microlenses form a color filter of an RGB Bayer array as one unit.

Although the color filters in the microlens 12 are seamlessly formed without being separated in actual situation, they are separated to correspond to the light receiving electrodes 71, 72, 73, and 74 in FIG. 15 for convenience.

The row selecting unit 13 selects the unit pixel cells belonging to the row designated as a horizontal-phase-difference raw data output row, using the designated row. Next, the A/D converter 15 reads the signal from the light receiving electrode 73 in the row, and converts it into a digital signal. Then, the vertical adding unit 22 adds the digital signals of the light receiving electrodes 71 and 73. Here, selecting the right contact of the vertical addition signal selecting switch 23 leads to addition of the signals from the two light receiving units in the microlens 12 in the vertical direction.

Furthermore, the row selecting unit 13 selects the unit pixel cells belonging to the column designated as a vertical-phase-difference raw data output column, using the designated column. Here, by selecting the left contact of the vertical addition signal selecting switch 23, the horizontal adding unit 24 adds the digital signals from the light receiving electrodes 71 and 72 to horizontally add the signals of the two light receiving units in the microlens 12.

Furthermore, the row selecting unit 13 selects the unit pixel cells belonging to an intersection of a horizontal-phase-difference raw data output row and a vertical-phase-difference raw data output column, using the designated row. Here, selecting the left contact of the vertical addition signal selecting switch 23, the column selecting unit 16 sequentially selects and outputs the digital signals of the light receiving electrodes 71 and 72. Next, the row selecting unit 13 selects a row adjacent to the designated row, and reads the signals of the light receiving electrodes 73 and 74. The A/D converter 15 converts the signals into digital signals. Here, selecting the left contact of the vertical addition signal selecting switch 23, the column selecting unit 16 sequentially selects and outputs the digital signals of the light receiving electrodes 73 and 74. With the operations, the signals of the four light receiving units in the microlens are independently output from the image sensor without using the vertical adding unit 22 and the horizontal adding unit 24.

Furthermore, the row selecting unit 13 selects a row in the unit pixel cell that is arranged in a matrix and is neither designated as a horizontal-phase-difference raw data output row nor a vertical-phase-difference raw data output column. Then, for example, the A/D converter 15 reads the signals of the light receiving electrodes 71 and 72, converts the signals into digital signals, and stores them in the buffer memory 21. Next, the row selecting unit 13 selects a row adjacent to the selected row. The A/D converter 15 reads the signals of the light receiving electrodes 73 and 74 in the adjacent row, and converts the signals into digital signals. Then, the vertical adding unit 22 adds the digital signals of the light receiving electrodes 71 and 73, and adds the digital signals of the light receiving electrodes 72 and 74. Here, by selecting the right contact of the vertical addition signal selecting switch 23, the horizontal adding unit 24 adds the digital signals from the light receiving electrodes 71 and 73 to the digital signals from the light receiving electrodes 72 and 74. In other words, all the signals from the four light receiving units in the microlens 12 are added. Finally, the column selecting unit 16 selects all the columns to which the additions by the horizontal adding unit 24 are output, thus outputting a main-image raw data signal from the image sensor.

[Still-Image Continuous Shooting by Imaging Apparatus]

Next, the details of continuous-shooting still images by the imaging apparatus according to Embodiment 2 will be described.

Figure 16:
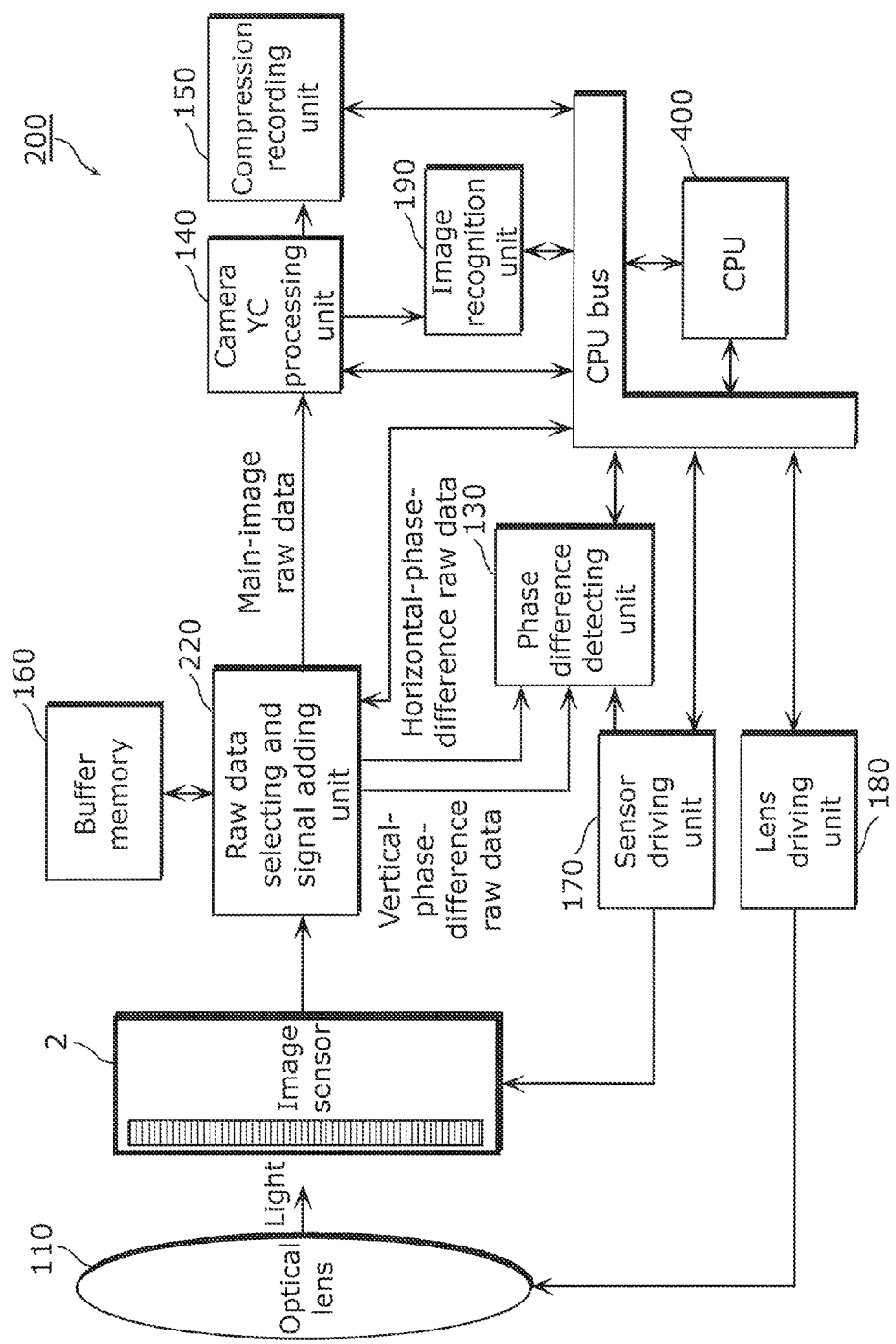
FIG. 16 is a block diagram illustrating a configuration of an imaging apparatus according to Embodiment 2.
Figure 17:
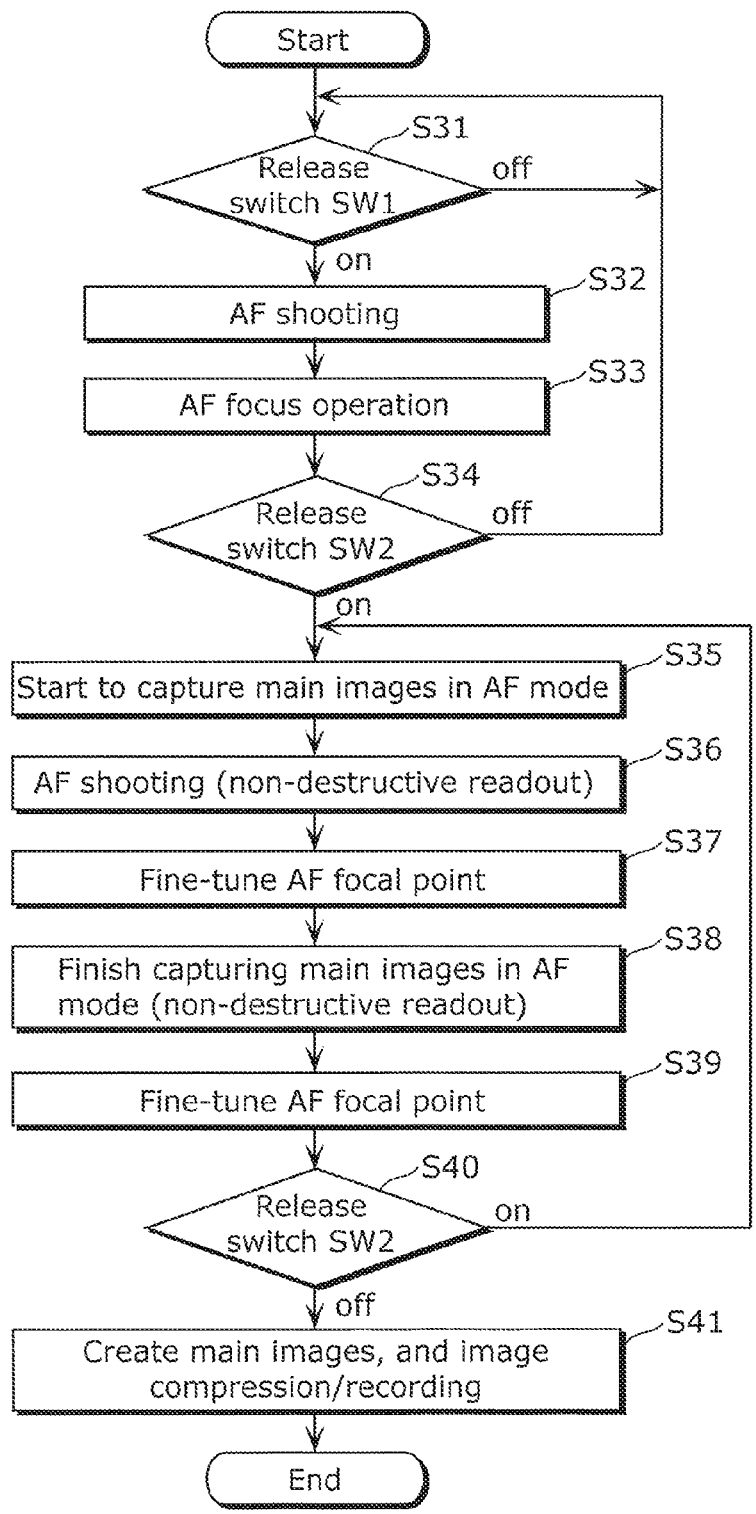
FIG. 17 is an operation flowchart in continuous-shooting still images by the imaging apparatus according to Embodiment 2.

FIG. 16 is a block diagram illustrating a configuration of an imaging apparatus 200 according to Embodiment 2. Furthermore, FIG. 17 is an operation flowchart in continuous-shooting still images by the imaging apparatus 200 according to Embodiment 2. The imaging apparatus 200 in FIG. 16 includes an image sensor 2, an optical lens 110, a raw data selecting and signal adding unit 220, a phase difference detecting unit 130, a camera YC processing unit 140, a compression recording unit 150, a buffer memory 160, a sensor driving unit 170, a lens driving unit 180, an image recognition unit 190, and a CPU 400.

First, the sequence of continuous-shooting still images by the imaging apparatus 200 with the structure will be described.

As indicated in FIG. 17, a release switch SW1 is turned ON, such as half-depressing the shutter button, during the startup in the still image capturing mode (S31). Accordingly, the AF shooting mode starts (S32). In the AF shooting mode, rows are selected by two rows from among part of all the rows. The signal corresponding to the optical image formed by each of the light receiving units using the pupil segmentation on the image sensor 2 through the optical lens 110, in the unit pixel cells belonging to the selected row is output to the vertical adding units 22. Each of the vertical adding units 22 adds the two signals in the vertical direction, and sequentially reads the signal. A procedure for outputting the phase-difference raw data in the AF shooting mode will be specifically described with reference to FIG. 18.

Figure 18:
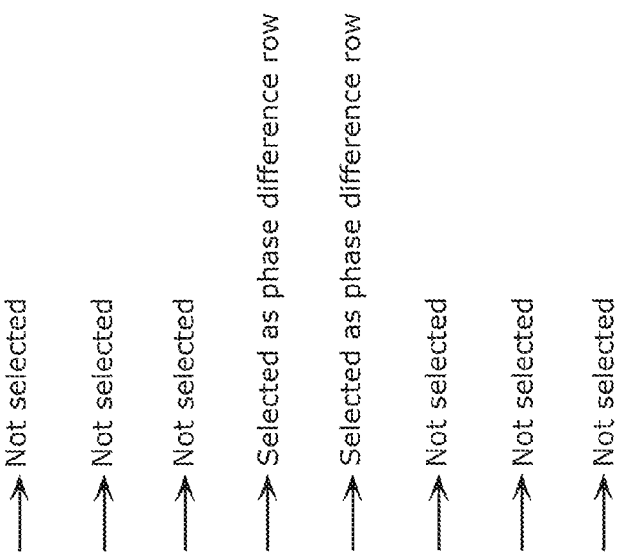
FIG. 18 conceptually illustrates a procedure for outputting image sensor signals in the AF shooting mode according to Embodiment 2.

FIG. 18 conceptually illustrates the procedure for outputting image sensor signals in the AF shooting mode according to Embodiment 2. In FIG. 18, the smallest area enclosed by the solid line represents one light receiving unit, and the encircled number to the right of each of the light receiving units represents an order of outputting the signals generated by the light receiving units, from the image sensor 1. Furthermore, one square enclosed by the thick line represents an area to be processed by the microlens 12.

In the example of FIG. 18, only the seventh, eighth, ninth, and tenth rows are selected as the phase difference rows. Thus, the first to sixth rows and 11th to 16th rows are neither selected nor read. The signals in the seventh and eighth rows are added in the vertical direction, and are output from the image sensor 2 in the order of G7a+G8a, G7b+G8b, B7c+B8c, B7d+B8d, G7e+G8e, G7f+G8f, B7g+B8g, and B7h+B8h. Next, the signals in the ninth and tenth rows are added in the vertical direction, and are output from the image sensor 2 in the order of R9a+R10a, R9b+R10b, G9c+G10c, G9d+G10d, R9e+R10e, R9f+R10f, G9g+G10g, and G9h+G10h. Since the phase difference rows designated by the row selecting unit 13 are sequentially read from the upper rows (earlier rows), a preceding signal (signal in the upper row) is temporarily held in the buffer memory 21 to vertically add signals. Then, the preceding signal and the succeeding signal (signal in the lower row) are added with timing after AD conversion on the succeeding signal. Since the number of the actual phase difference rows to be read in the AF shooting mode is approximately 20 rows in one screen and all the pixels do not have to be read, the high-speed operation is possible without having any practical problem in the prolonged output operation period. Here, the rows do not have to be read in a non-destructive readout mode. Furthermore, the CPU 400 can cause the sensor driving unit 170 to arbitrarily set an assignment address for assigning a phase difference row by two rows.

Figure 19:
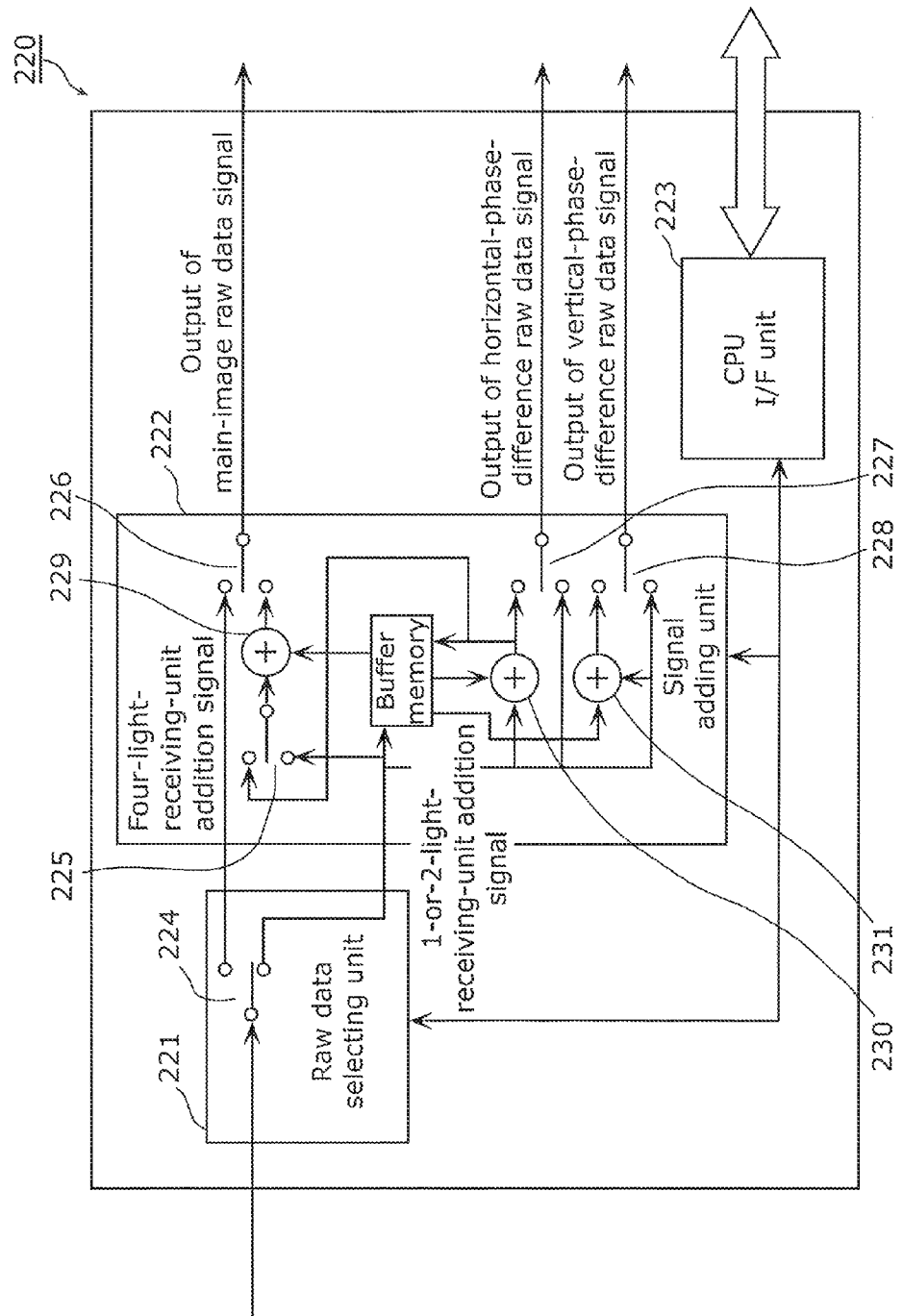
FIG. 19 is a block diagram illustrating a configuration of a raw data selecting and signal adding unit included in the imaging apparatus according to Embodiment 2.

FIG. 19 is a block diagram illustrating a configuration of the raw data selecting and signal adding unit 220 included in the imaging apparatus according to Embodiment 2. The raw data selecting and signal adding unit 220 includes a raw data selecting unit 221, a signal adding unit 222, and a CPU I/F unit 223.

The image sensor including phase difference information on the optical lens 110 outputs, to the phase difference detecting unit 130, as a vertical-two-light-receiving-unit addition signal that is a horizontal-phase-difference raw data signal, by selecting the lower contact of a raw data assignment switch 224 in the raw data selecting unit 221. Accordingly, the phase difference detecting unit 130 detects a focal point.

Here, with the selection of the lower contact of a horizontal-phase-difference raw data selection switch 227 in the signal adding unit 222, the horizontal-phase-difference raw data signals are output to the phase difference detecting unit 130 as they are without using the addition function.

Next, in the phase difference detecting unit 130, in order that the pupil plane horizontal selecting unit 131 selectively separates signals corresponding to the left-right pupil planes and detects the phase difference, the color carrier suppressing unit 132 performs LPF processing to remove the color carrier, and the left-right signal phase difference detecting unit 133 obtains a left-pupil plane phase difference detection signal and a right-pupil plane phase difference detection signal. The phase difference detecting unit 130 detects a phase difference corresponding to a degree of defocus by detecting a difference in waveform between the left-pupil plane phase difference detection signal and the right-pupil plane phase difference detection signal, and communicates with the CPU 400 via the CPU I/F unit 134 on the CPU bus, based on the result of detection. The operations of the phase difference detecting unit 130 are the same as those according to Embodiment 1. The sequence of detecting the phase difference by the phase difference detecting unit 130 will be specifically described with reference to FIG. 20.

Figure 20:
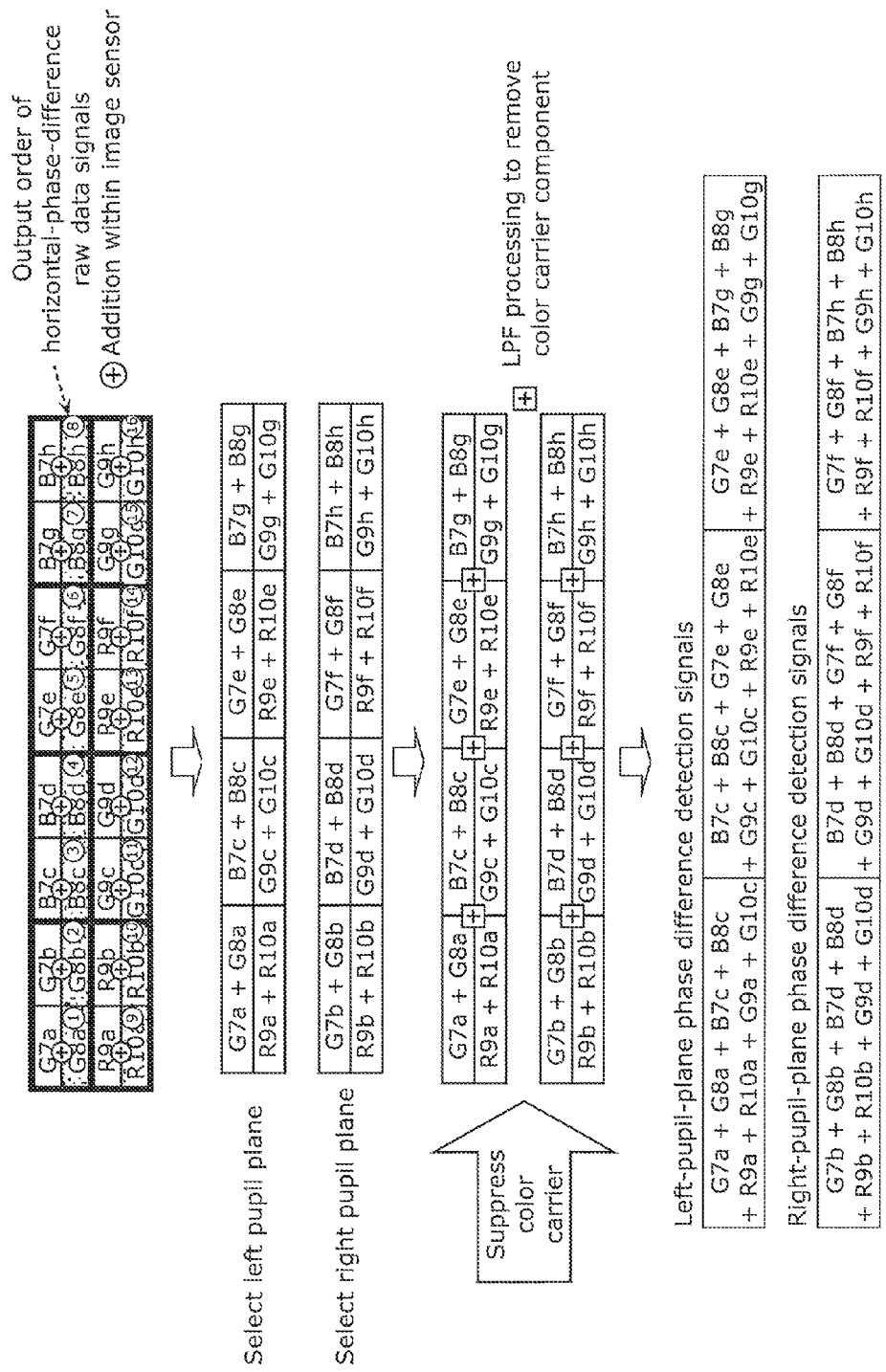
FIG. 20 conceptually illustrates operations of the phase difference detecting unit according to Embodiment 2 in detail.

FIG. 20 conceptually illustrates operations of the phase difference detecting unit according to Embodiment 2 in detail. As illustrated in FIG. 20, signals in the light receiving units within the unit pixel cells belonging to a row selected as a phase difference row are vertically added. Then, the left and right signals of the pupil plane are selectively separated. In other words, G7$a$+G8$a$, B7$c$+B8$c$, G7$e$+G8$e$, B7$g$+B8$g$, R9$a$+R10$a$, G9$c$+G10$c$, R9$e$+R10$e$, and G9$g$+G10$g$ are selected as the left signals of the pupil plane. Furthermore, G7$b$+G8$b$, B7$d$+B8$d$, G7$f$+G8$f$, B7$h$+B8$h$, R9$b$+R10$b$, G9$d$+G10$d$, R9$f$+R10$f$, and G9$h$+G10$h$ are selected as the right signals of the pupil plane. Then, to suppress the color carrier, each of the left and right RGB Bayer array signals (for example, G7$a$+G8$a$, B7$c$+B8$c$, R9$a$+R10$a$, and G9$c$+G10$c$) are added to obtain the phase difference detection signals for each of the left and right pupil planes. In FIG. 20, three left-pupil-phase phase difference detection signals and three right-pupil-phase phase difference detection signals are generated.

Since the phase difference AF rows are selected by two rows, the RG rows and GB rows that are vertically adjacent are selected, thus enabling high-accuracy phase difference detection using the color signals including all the RGB components without disturbing the RGB Bayer array of the main image. Furthermore, since information on all the pixels is horizontally obtained, the phase difference can be detected from pixels at the horizontal Nyquist frequency.

Back to FIGS. 16 and 17 again, the operations of the imaging apparatus 200 will be continuously described.

The CPU 400 that obtains information on the result of phase difference detection performs a distance calculation, and temporarily completes the AF focus operation by causing the lens driving unit 180 to move the focus lens of the optical lens 110 to an appropriate position (S33).

Next, a release switch SW2 is turned ON, such as depressing the shutter button fully (S34). Accordingly, still images for the main images start to be captured (S35). Here, at the beginning of a period for storing the captured main images, the reset operation of the image sensor 2 is stopped, and the operation as same as that in the AF shooting mode is performed in the non-destructive readout mode (S36). If necessary, the focus lens is fine-tuned based on the result of phase difference detection of the obtained main images, that is, the AF focal point is fine-tuned (S37).

Next, at the end of or after the period for storing the captured main images, the main images are read with the AF shooting mode (destructive readout).

Figure 21:
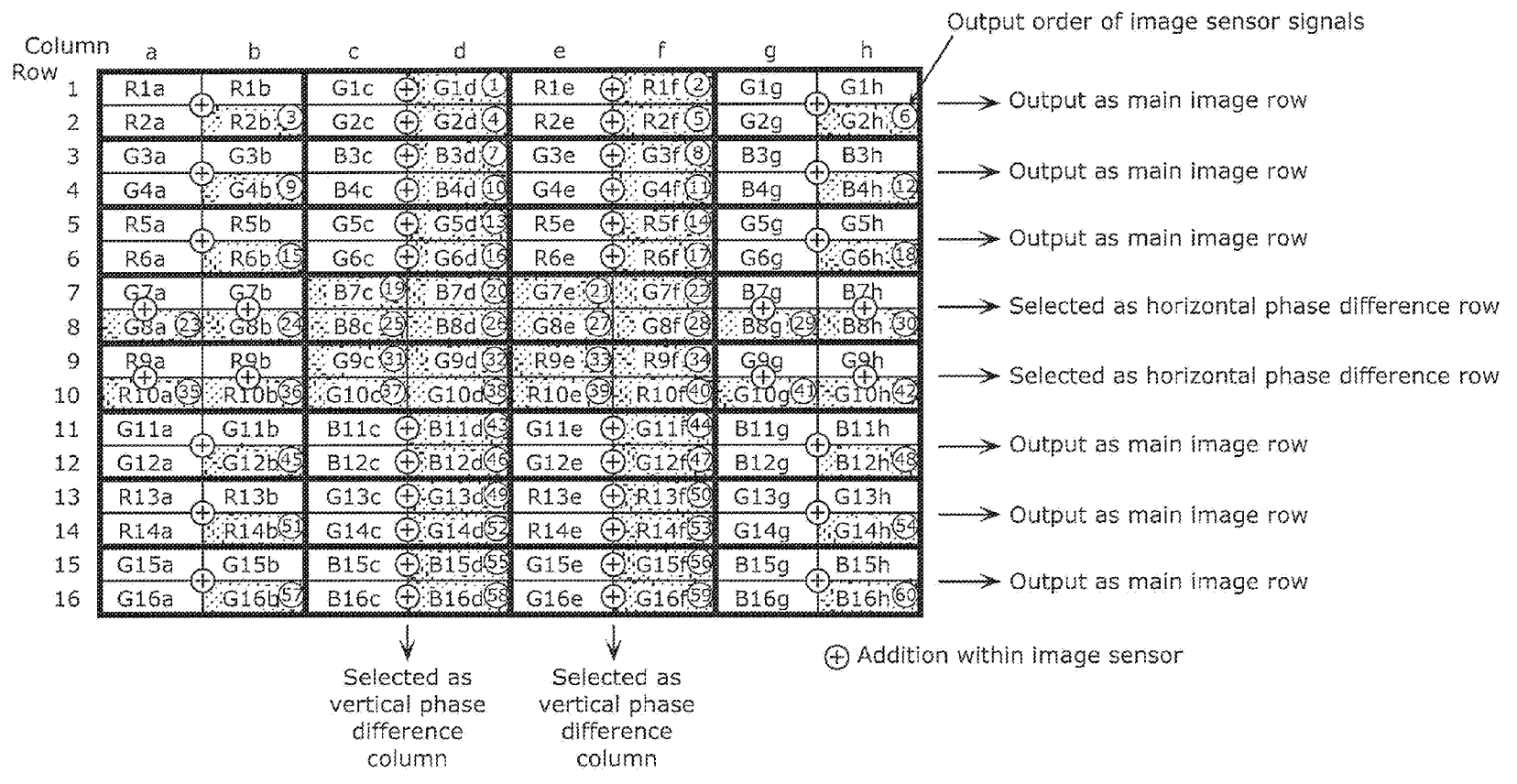

FIG. 21 conceptually illustrates a procedure for outputting image sensor signals in capturing main images in AF mode according to Embodiment 2. In FIG. 21, the encircled + sign indicates adding signals in the image sensor 2, and one square enclosed by the thick line represents an area to be processed by the microlens 12. The encircled numbers represent the order of outputting the signals.

As illustrated in FIG. 21, the vertical adding unit 22 adds, in a row selected as a horizontal difference row, the signal data items detected by the light receiving unit electrodes obtained by separating the optical lens pupil plane in the microlens 12 into 4, as the signals of the two light receiving units for reading in capturing main images in AF mode. Furthermore, the horizontal adding unit 24 adds, in a column selected as a vertical phase difference column, the signal data items detected by the light receiving unit electrodes obtained by separating the optical lens pupil plane in the microlens 12 into 4, as the signals of the two light receiving units. Furthermore, at the intersection of a horizontal phase difference row and a vertical phase difference column, signal data items detected by the four light receiving units separated in the optical lens pupil plane in the microlens 12 are individually sequentially output from the image sensor 2. Furthermore, the horizontal adding unit 24 and the vertical adding unit 22 add four signal data items detected by the light receiving unit electrodes separated in the optical lens pupil plane in the microlens 12 into 4, in each unit pixel cell that is not included in a phase difference matrix, and successively output the resulting signals from the image sensor.

In other words, when a column is designated for the light receiving units that should generate partial addition signals and non-addition independent signals, the signal adding unit 222 can horizontally add the photoelectric conversion signals of the light receiving units belonging to the designated column. Furthermore, when a row is designated for the light receiving units that should generate partial addition signals and non-addition independent signals, the signal adding unit 222 can vertically add the photoelectric conversion signals of the light receiving units belonging to the designated row. Furthermore, when both a row and a column are designated for the light receiving units that should generate partial addition signals and non-addition independent signals, the photoelectric conversion signals of the light receiving units belonging to the designated row and column can be independently read.

Next, the detailed signal processing by the raw data selecting and signal adding unit 220 in FIG. 16 will be described.

The image sensor 2 successively outputs, from the upper rows (earlier rows), mixed signals, that is, four-light-receiving-unit addition signals, horizontal-two-light-receiving-unit addition signals, vertical-two-light-receiving-unit addition signals, and light-receiving-unit single signals, while being horizontally scanned as illustrated in FIG. 21. Since the signal output order is limited by the light receiving unit electrode to be finally output for the addition, signals are output in the order following the encircled numbers in FIG. 21. Furthermore, the addresses that are not shaded in FIG. 21 are skipped for the output.

In the example of FIG. 21, in the first row, the signals are output from the image sensor 2 in the order of G1$c$+G1$d$ and R1$e$+R1$f$. Next, in the second row, the signals are output from the image sensor 2 in the order of R1a+R1b+R2a+R2b, G1c+G2d, R2e+R2f, and G1g+G1h+G2g+G2h. In the third to sixth rows, the same output order as those of the first and second rows is used. Next, in the seventh row, the signals are output from the image sensor 2 in the order of B7c, B7d, G7e, and G7f. In the eighth row, the signals are output from the image sensor 2 in the order of G7a+G8a, G7b+G8b, B8c, B8d, G8e, G8f, B7g+B8g, and B7h+B8h. In the ninth to tenth rows, the same output order as those of the seventh and eighth rows is used. In the 11th to 16th rows, the same output order as those of the first and second rows is used.

The first, second, seventh, and eighth rows will be specifically described with reference to FIGS. 19 and 21.

First, the lower contact of a raw data assignment switch 224 in the raw data selecting unit 221 is selected, and the signal data items G1c+G1d and R1e+R1f are output as the phase-difference raw data items (horizontal-two-light-receiving-unit addition signals). Then, the lower contact of a vertical phase-difference raw data selection switch 228 is selected, and the signal data items G1c+G1d and R1e+R1f are output as the vertical-phase-difference raw data signals as they are, and stored in the buffer memory of the signal adding unit 222.

Next, the upper contact of the raw data assignment switch 224 is selected, and the signal data R1a+R1b+R2a+R2b in the second row is output as the main-image raw data (four-light-receiving-unit addition signal). Then, the upper contact of a main-image raw data selection switch 226 is selected, and the signal data R1a+R1b+R2a+R2b is output as a main-image raw data signal as it is.

The lower contact of the raw data assignment switch 224 is selected, and the signal data G2c+G2d is output as the phase-difference raw data (horizontal-two-light-receiving-unit addition signal). Then, the lower contact of the vertical phase-difference raw data selection switch 228 is selected, and the signal data G2c+G2d is output as a vertical-phase-difference raw data signal as it is. Accordingly, the lower contact of the two-light-receiving-unit vertical addition signal selection switch 225 is selected, and the signal G1c+G1d stored in the buffer memory is read. Then, a main image signal adding unit 229 adds the read signal G1c+G1d and the signal data G2c+G2d. With the selection of the lower contact of the main-image raw data selection switch 226, the resulting signal G1C+G1d+G2c+G2d is output as a main-image raw data signal.

The lower contact of the raw data assignment switch 224 is selected, and the signal data R2e+R2f is output as the phase-difference raw data (horizontal-two-light-receiving-unit addition signal). Then, the lower contact of the vertical phase-difference raw data selection switch 228 is selected, and the signal data R2e+R2f is output as the vertical-phase-difference raw data signal as it is. Accordingly, the lower contact of the two-light-receiving-unit vertical addition signal selection switch 225 is selected, and the signal R1e+R1f stored in the buffer memory is read. Then, the main image signal adding unit 229 adds the read signal R1e+R1f and the signal data R2e+R2f. With the selection of the lower contact of the main-image raw data selection switch 226, the resulting signal R1e+R1f+R2e+R2f is output as a main-image raw data signal.

The upper contact of the raw data assignment switch 224 is selected, and the signal data G1g+G1h+G2g+G2h is output as the main-image raw data (four-light-receiving-unit addition signal). Then, the upper contact of the main-image raw data selection switch 226 is selected, and the signal data G1g+G1h+G2g+G2h is output as a main-image raw data signal as it is.

Next, the lower contact of the raw data assignment switch 224 is selected, and the signal data B7c in the seventh row is output as the phase-difference raw data (a light-receiving-unit signal), and is stored in the buffer memory. Next, the lower contact of the raw data assignment switch 224 is selected, and the signal data B7d is output as the phase-difference raw data (a light-receiving-unit signal), and is stored in the buffer memory. Accordingly, a vertical phase difference signal adding unit 231 adds the signal data B7d and the signal data B7c stored in the buffer memory, thus resulting B7c+B7d. Then, the upper contact of the vertical phase-difference raw data selection switch 228 is selected, and the resulting signal B7c+B7d is output as a vertical-phase-difference raw data signal.

The lower contact of the raw data assignment switch 224 is selected, and the signal data G7e is output as the phase-difference raw data (a light-receiving-unit signal), and is stored in the buffer memory. Next, the lower contact of the raw data assignment switch 224 is selected, and the signal data G7f is output as the phase-difference raw data (a light-receiving-unit signal), and is stored in the buffer memory. Accordingly, the vertical phase difference signal adding unit 231 adds the signal data G7f and the signal data G7e stored in the buffer memory, thus resulting G7e+G7f. Then, the upper contact of the vertical phase-difference raw data selection switch 228 is selected, and the resulting signal G7e+G7f is output as a vertical-phase-difference raw data signal.

Next, for the eighth row, the lower contact of the raw data assignment switch 224 is selected, and the signal data G7a+G8a is output as the phase-difference raw data (vertical-two-light-receiving-unit addition signal). Then, the lower contact of the horizontal-phase-difference raw data selection switch 227 is selected, and the signal data G7a+G8a is output as a horizontal-phase-difference raw data signal as it is. Additionally, the signal data G7a+G8a is stored in the buffer memory of the signal adding unit 222. Next, the lower contact of the raw data assignment switch 224 is selected, and the signal data G7b+G8b is output as the phase-difference raw data (vertical-two-light-receiving-unit addition signal). Then, the lower contact of the horizontal-phase-difference raw data selection switch 227 is selected, and the signal data G7b+G8b is output as a horizontal-phase-difference raw data signal as it is. Additionally, the lower contact of the two-light-receiving-unit vertical addition signal selection switch 225 is selected, and the signal G7a+G8a stored in the buffer memory is read. The main image signal adding unit 229 adds the read signal G7a+G8a and the signal data G7b+G8b, thus resulting G7a+G8a+G7b+G8b. Then, the upper contact of the main-image raw data selection switch 226 is selected, and the resulting signal G7a+G8a+G7b+G8b is output as a main-image raw data signal.

The lower contact of the raw data assignment switch 224 is selected, and the signal data B8c is output as the phase-difference raw data (a light-receiving-unit signal), and is stored in the buffer memory. Accordingly, a horizontal phase difference signal adding unit 230 adds the signal B7c read from the buffer memory to the signal data B8c, thus resulting B7c+B8c. Then, the upper contact of the horizontal-phase-difference raw data selection switch 227 is selected, and the resulting signal B7c+B8c is output as a horizontal-phase-difference raw data signal, and is also written back to the buffer memory. Next, the lower contact of the raw data assignment switch 224 is selected, and the signal data B8d is output as the phase-difference raw data (a light-receiving-unit signal). Accordingly, the vertical phase difference signal adding unit 231 adds the signal data B8c stored in the buffer memory to the signal data B8d, thus resulting B8c+B8d. Then, the upper contact of the vertical phase-difference raw data selection switch 228 is selected, and the resulting signal B8c+B8d is output as vertical-phase-difference raw data signal. Accordingly, the horizontal phase difference signal adding unit 230 adds the signal B7d read from the buffer memory to the signal data B8d, thus resulting B7d+B8d. Then, the upper contact of the horizontal-phase-difference raw data selection switch 227 is selected, and the resulting signal B7d+B8d is output as a horizontal-phase-difference raw data signal. Accordingly, the main image signal adding unit 229 adds the resulting signal B7d+B8d to B7c+B8c stored in the buffer memory, thus resulting B7c+B8c+B7d+B8d. Then, the lower contact of the main-image raw data selection switch 226 is selected, and the resulting signal B7c+B8c+B7d+B8d is output as a main-image raw data signal.

Similarly, the same operations as those of the signal data items B8c and B8d are performed on the signal data items G8e and G8f. Furthermore, the same operations as those of the signal data items G7a+G8a and G7b+G8b are performed on the signal data B7g+B8g and B7h+B8h.

Furthermore, the same operations as those of the seventh and eighth rows are performed on the ninth and tenth rows. Furthermore, the same operations as those of the first and second rows are performed on the 11th row and rows after the 12th row.

Figure 22:
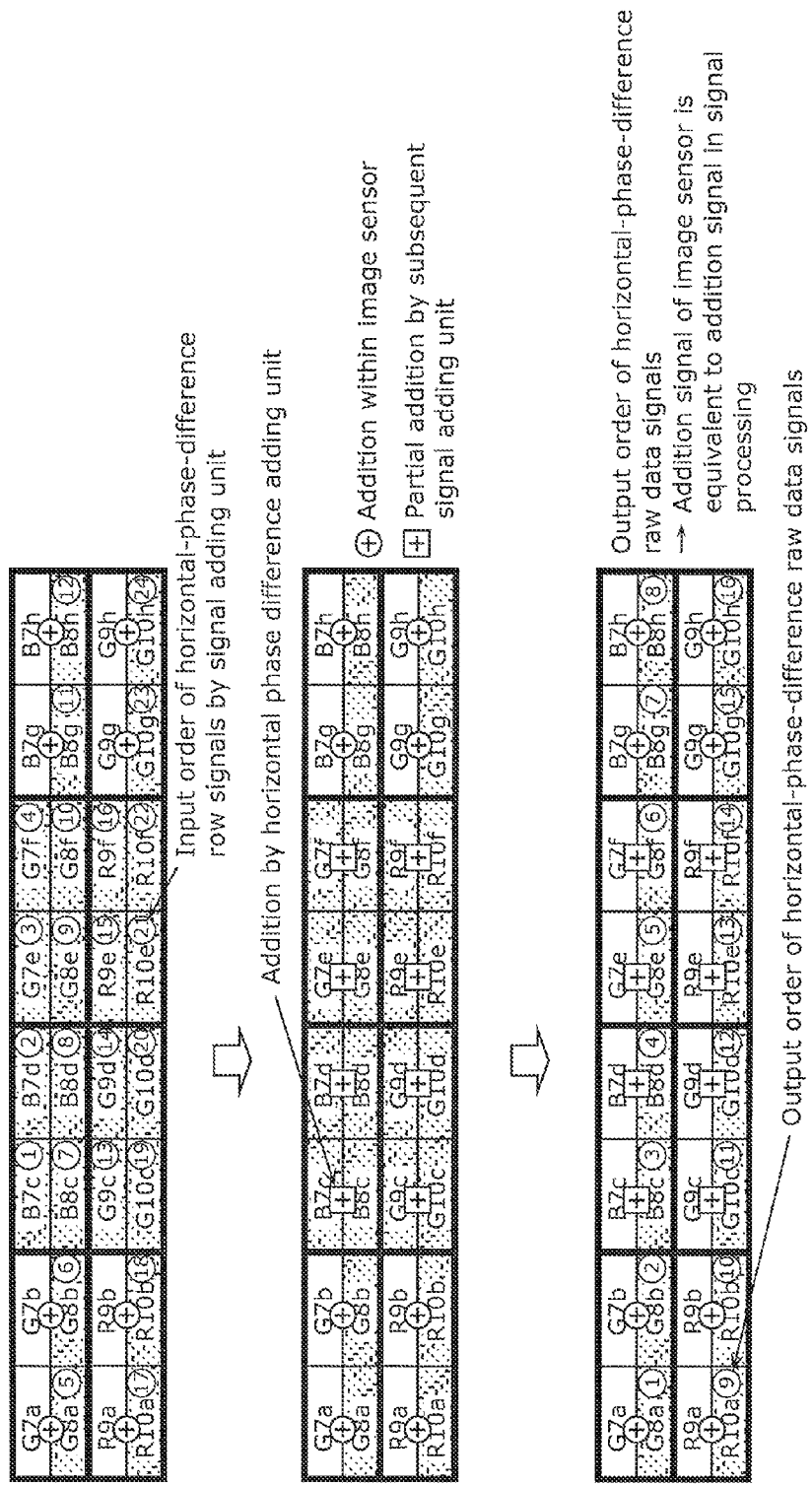
FIG. 22 conceptually illustrates addition of horizontal-phase-difference raw data signals in capturing main images in AF mode according to Embodiment 2.

FIG. 22 conceptually illustrates addition of horizontal-phase-difference raw data signals in capturing main images in AF mode according to Embodiment 2. In FIG. 22, the encircled + sign indicates adding signals in the image sensor 2, and the rectangle + sign indicates adding partial signals by the adding unit placed subsequent to the image sensor 2. The addition signal in the image sensor 2 is equivalent to the partial signal in the adding unit. Furthermore, these signals are conceptually the same as the signals selected using the phase difference rows in FIG. 10 according to Embodiment 1. The color carrier in the signals is suppressed as in FIG. 20. Accordingly, the phase difference can be horizontally detected.

As described above, the imaging apparatus 200 according to Embodiment 2 includes a signal generating unit configured to read the photoelectric conversion signal from each of the light receiving units, and generate (i) a full-addition signal by adding all of the photoelectric conversion signals obtained in a predetermined frame by four of the light receiving units corresponding to the microlens 12, (ii) a partial addition signal by adding the photoelectric conversion signals obtained by at least one but not all of the four light receiving units, and (iii) non-addition independent signals that are the photoelectric conversion signals of one of the four light receiving units. The signal generating unit includes the buffer memories 21, the vertical adding units 22, the vertical addition signal selecting switches 23, and the horizontal adding units 24 that are included in the image sensor 2, and the raw data selecting and signal adding unit 220 that is placed subsequent to the image sensor 2. The raw data selecting and signal adding unit 220 includes: the raw data selecting unit 221 that is a signal selecting unit that selects one of (i) the partial addition signal (two light receiving units) and the non-addition independent signals (one light receiving unit) and (ii) the full-addition signal (four light receiving units); and the signal adding unit 222 that outputs, to the phase difference detecting unit 130, the partial addition signal out of (i) the partial addition signal and the non-addition independent signals selected by the raw data selecting unit 221, and outputs the full-addition signal to the camera YC processing unit 140. The partial addition signal is generated by adding the photoelectric conversion signals obtained by at least one but not all of the two or more adjacent light receiving units corresponding to the microlens 12, and the full-addition signal is generated by adding the photoelectric conversion signals obtained by the two or more adjacent light receiving units.

Figure 23:
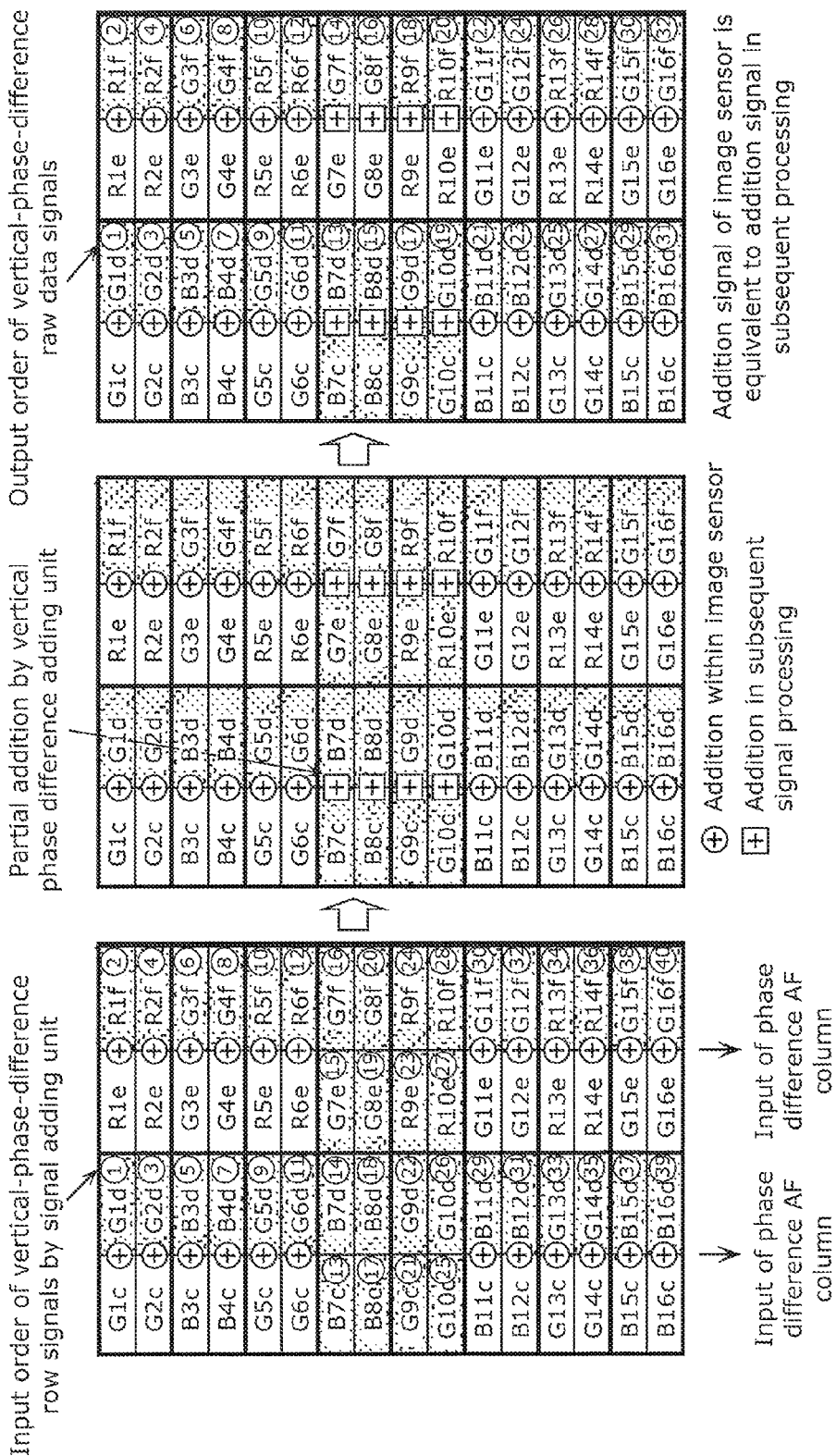
FIG. 23 conceptually illustrates addition of vertical-phase-difference raw data signals in capturing main images in AF mode according to Embodiment 2.

FIG. 23 conceptually illustrates addition of vertical-phase-difference raw data signals in capturing main images in AF mode according to Embodiment 2. In FIG. 23, the partial addition signal in a unit subsequent to the image sensor 2 is equivalent to the partial addition signal obtained by addition by the unit subsequent to the image sensor 2. Furthermore, the concept of adding the vertical-phase-difference raw data signals in FIG. 23 is derived from rotating the addition of the horizontal-phase-difference raw data signals in FIG. 22 by 90 degrees. Similarly, the color carrier is suppressed. Accordingly, the phase difference can be vertically detected.

Figure 24:
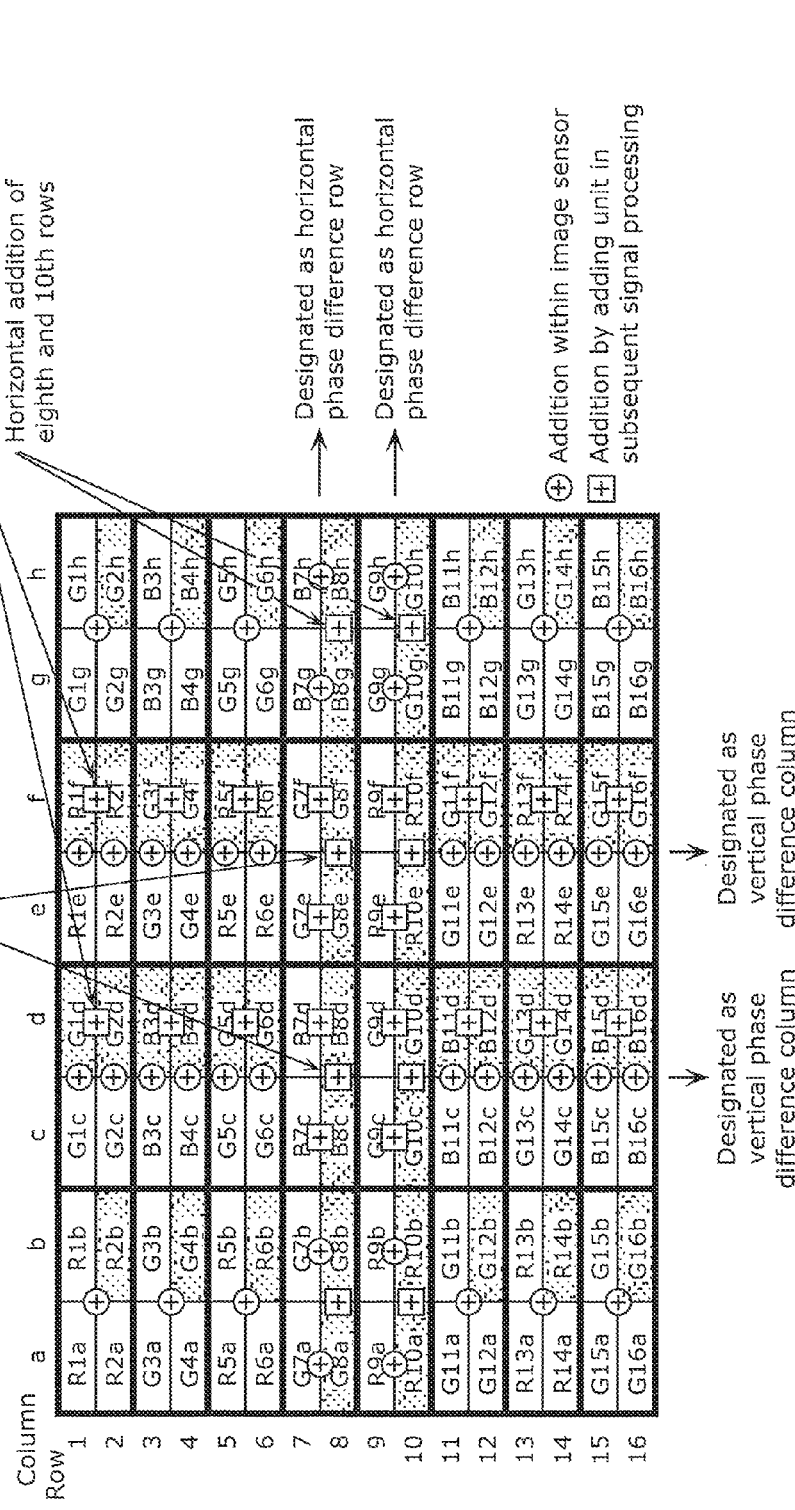
FIG. 24 FIG. 24 conceptually illustrates addition of main-image raw data signals by the adding unit in capturing main images in AF mode according to Embodiment 2.
Figure 25:
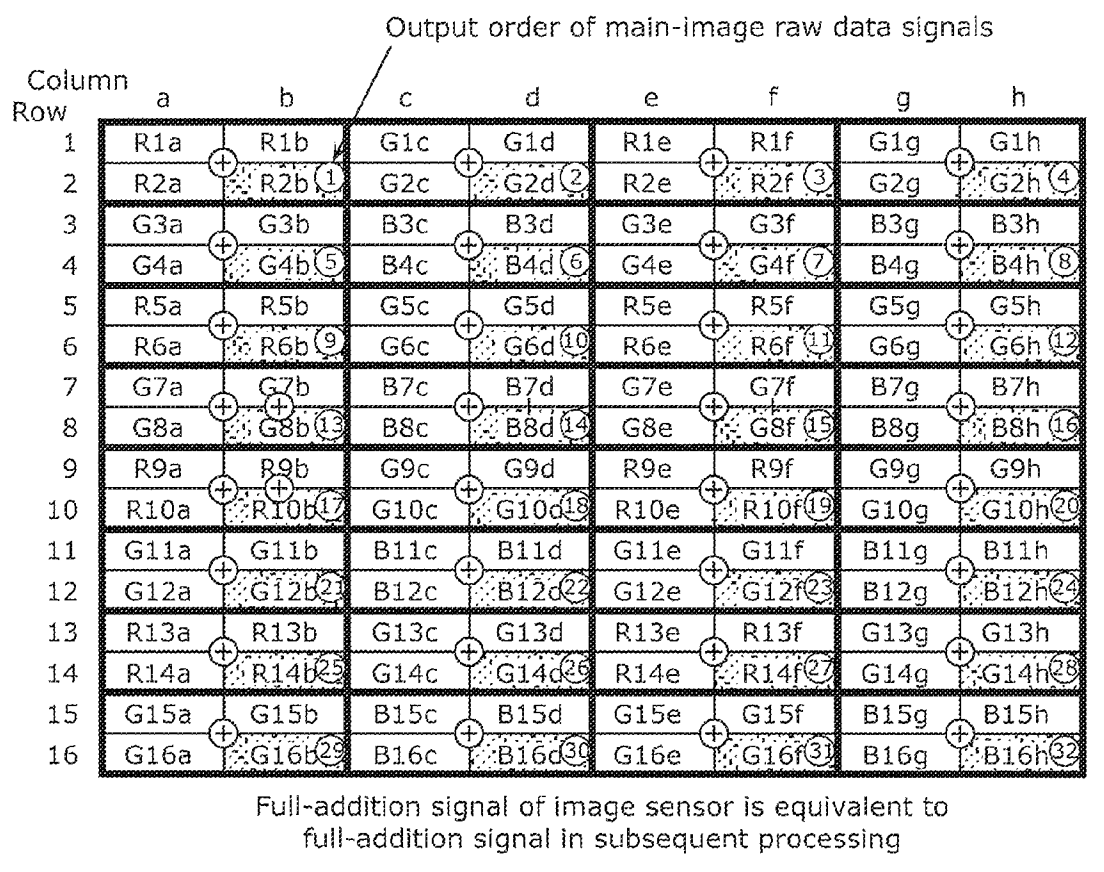

FIG. 24 conceptually illustrates addition of main-image raw data signals by the adding unit in capturing main images in AF mode according to Embodiment 2. Furthermore, FIG. 25 conceptually illustrates output of main-image raw data signals by the adding unit in capturing main images in AF mode according to Embodiment 2. As illustrated in FIGS. 24 and 25, the full-addition signal of the image sensor 2 is equivalent to the full-addition signal of the adding unit subsequent to the image sensor 2. Furthermore, the phase difference AF rows, the phase difference AF columns, and address portions at the intersections of the phase difference AF rows and columns have uniform main image signals. Furthermore, the output pixel image is as illustrated in FIG. 25, which is equivalent to the general Bayer array of still images in which the microlens 12 is defined as a pixel.

Here, capturing main images in AF mode is finished (S38).

As a result of detecting any horizontal and vertical phase difference, the AF focal point is fine-tuned if necessary (S39).

Next, when the release switch SW2 continues to be turned ON (ON at S40), the read main-image raw data signal is stored in the buffer memory 160 and others. Then, the process is back to the start of capturing main images in AF mode (S35), and the same operations are subsequently continued.

When the release switch SW2 is turned OFF (OFF at S40), the following processes are successively performed on the main-image raw data signal stored in the buffer memory 160 (S41).

The following operations are basically the same as those of a digital camera with a general Bayer array. More specifically, the raw data selecting unit 221 selects the main-image raw data output as a main image. Then, the compression recording unit 150 compresses the data in JPEG or others through the camera YC processing unit 140, and the data is recorded in a medium. At the completion of the processes on all the main image row data items stored in the buffer memory 160, the still-image continuous shooting is completed.

In other words, in the still-image continuous shooting by the imaging apparatus 200, the signal generating unit in the image sensor 2 outputs a partial addition signal and non-addition independent signals to the phase difference detecting unit 130 through the raw data selecting and signal adding unit 220 in a non-destructive readout mode at the beginning of the charge storage period in which the charge generated by the light received by each of the light receiving units is continuously stored without being reset. Furthermore, at the end of and after the charge storage period, the full-addition signals are output to the camera YC processing unit 140 through the raw data selecting and signal adding unit 220.

With the operations, the focal point can be detected during storing the charge of the main image signal using the non-destructive readout mode. Furthermore, while detecting the horizontal and vertical phase difference signals from the stored main image signals, the main-image raw data can be completely restored by the addition through the signal processing. Accordingly, in the high-speed continuous shooting in which the main images are continuously captured, still images can be continuously captured with the phase difference AF function without any degradation in the main image.

Here, the image recognition unit 190 performs object recognition and others by tracking an address to designate the phase difference AF matrix, thus achieving the continuous shooting with AF tracking using the image-plane phase difference AF.

With elimination of the processes of "AF shooting (non-destructive readout)" (S36) and the subsequent "Fine-tune AF focal-point" (S37) and only the shooting in a destructive readout mode, an image sensor that does not have the non-destructive readout function can shoot still images without any degradation in the main image while the phase difference AF function is continued. Here, the image sensor includes photoelectric conversion elements such as photodiodes and embedded photodiodes, in the semiconductor substrate.

Furthermore, although the central portion of the microlens 12 has an insensitive area as a separate area as illustrated in FIG. 15, decrease in the sensitivity can be minimized using, for example, a digital microlens (DML).

Furthermore, a large area of an intersection designated in the phase difference AF matrix is allocated by using multiples of 2, so that the phase difference detection AF can be performed two-dimensionally in all directions in any two-dimensional matrix.

Embodiment 3

Hereinafter, the structure and operations of an imaging apparatus and an image sensor included in the imaging apparatus according to Embodiment 3, mainly the differences from Embodiments 1 and 2 will be described with reference to the drawings.

The image sensor (solid-state imaging device) according to Embodiment 3 is the same as the image sensor 1 (solid-state imaging device) illustrated in FIGS. 1 to 5 according to Embodiment 1.

[Single-Shooting Still Images by Imaging Apparatus]

The details of single-shooting still images by the imaging apparatus according to Embodiment 3 will be described.

Figure 26:
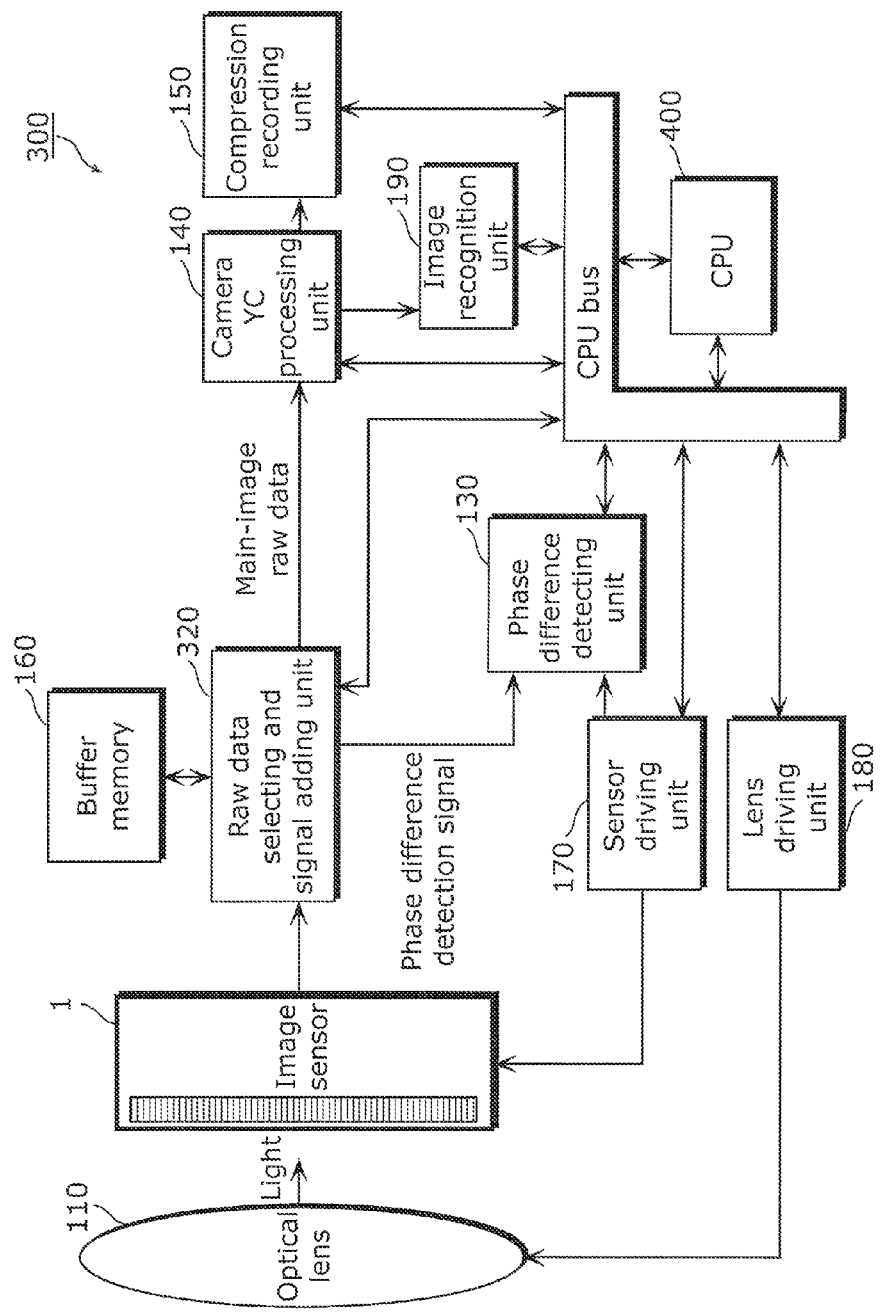
FIG. 26 is a block diagram illustrating a configuration of an imaging apparatus according to Embodiment 3.
Figure 27:
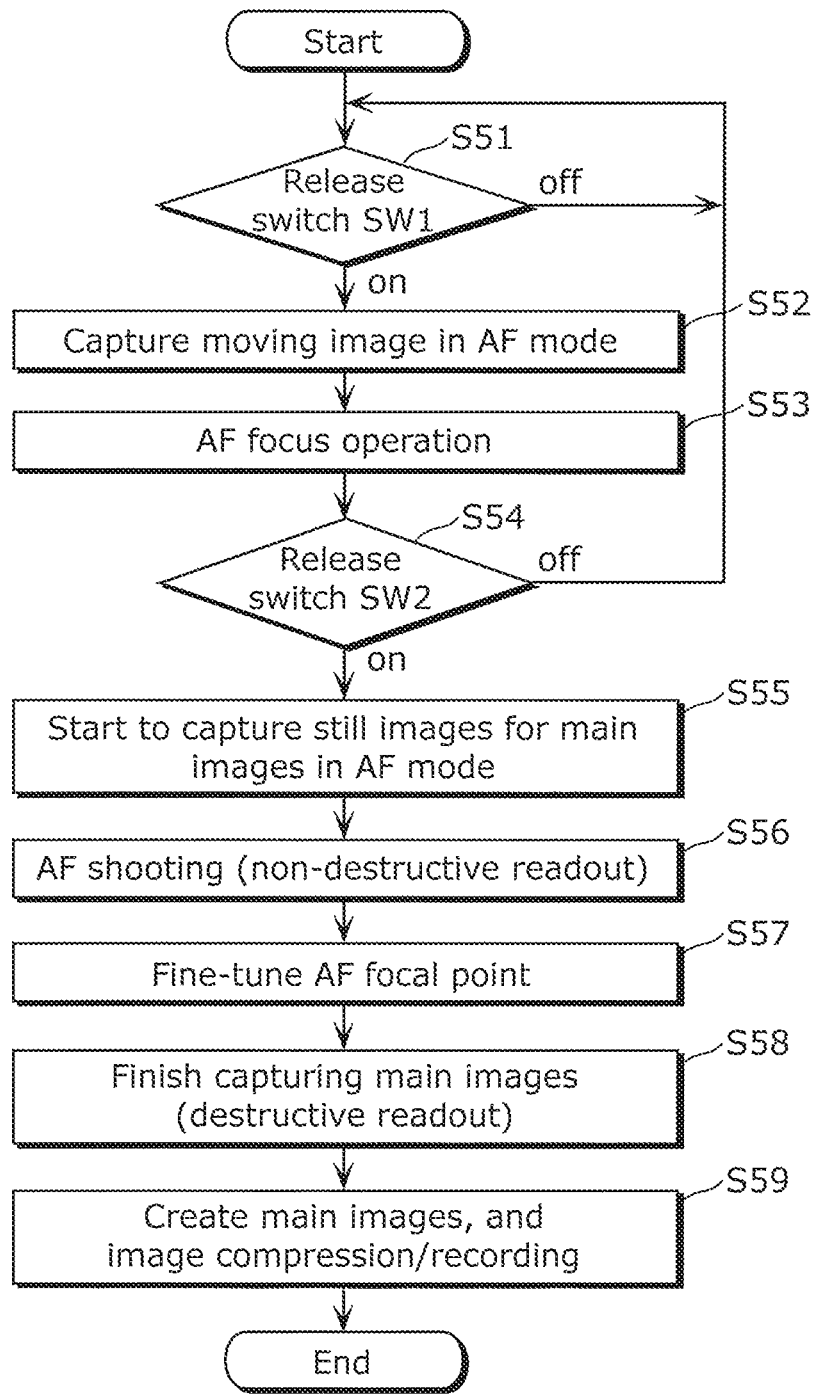
FIG. 27 is an operation flowchart in single-shooting still images by the imaging apparatus according to Embodiment 3.
Figure 28:
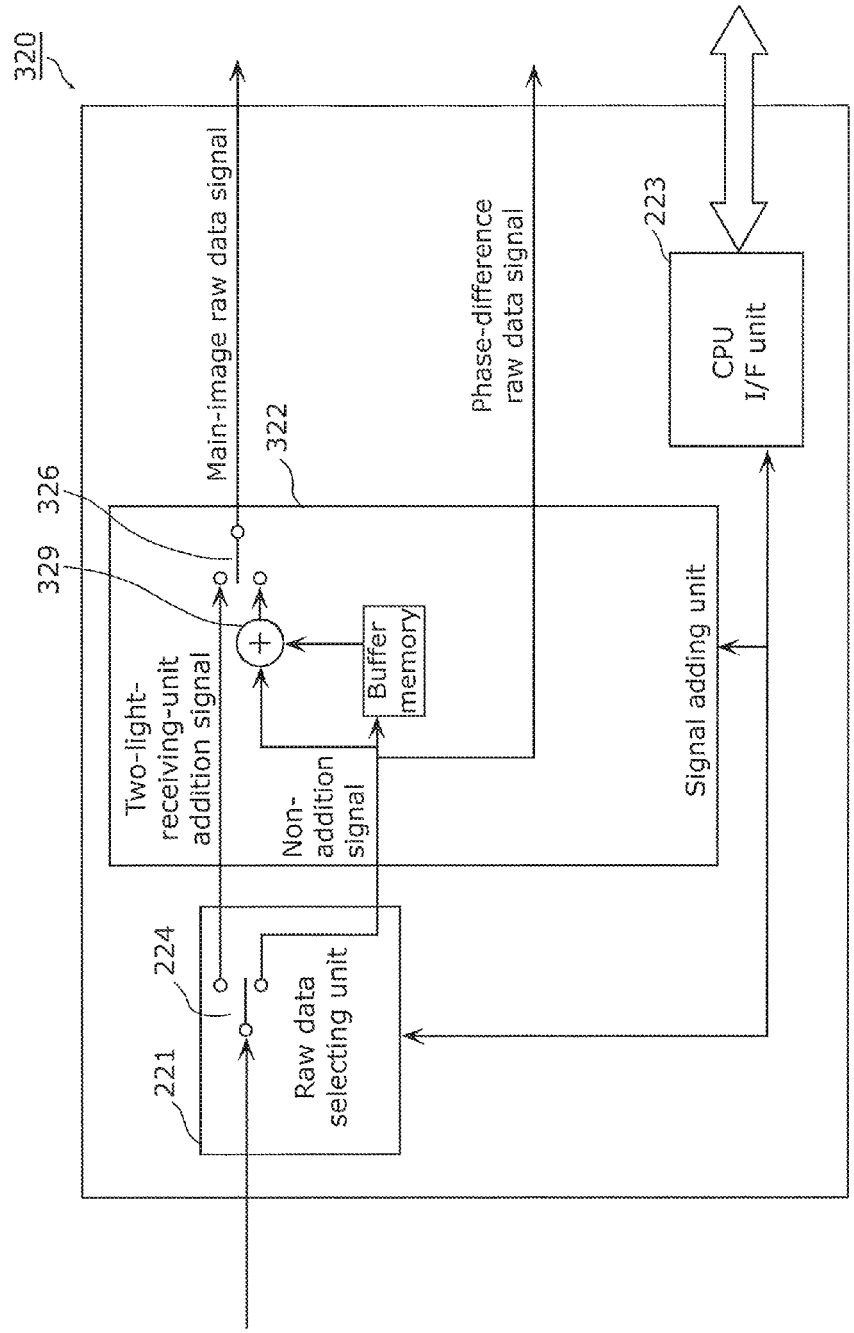
FIG. 28 is a block diagram illustrating a configuration of a raw data selecting and signal adding unit included in the imaging apparatus according to Embodiment 3.

FIG. 26 is a block diagram illustrating a configuration of an imaging apparatus 300 according to Embodiment 3. Furthermore, FIG. 27 is an operation flowchart in single-shooting still images by the imaging apparatus according to Embodiment 3. FIG. 28 is a block diagram illustrating a configuration of a raw data selecting and signal adding unit 320 included in the imaging apparatus according to Embodiment 3. The imaging apparatus 300 in FIG. 26 includes an image sensor 1, an optical lens 110, the raw data selecting and signal adding unit 320, a phase difference detecting unit 130, a camera YC processing unit 140, a compression recording unit 150, a buffer memory 160, a sensor driving unit 170, a lens driving unit 180, an image recognition unit 190, and a CPU 400.

First, the sequence of single-shooting still images by the imaging apparatus 300 with the structure will be described.

As indicated in FIG. 27, a release switch SW1 is turned ON, such as half-depressing the shutter button during the startup in the still image capturing mode (S51). Accordingly, capturing a moving image in AF mode starts as a viewfinder mode for adjusting the image frame (S52). In capturing a moving image in AF mode, all the rows including mixed pixels are selected as the phase difference AF rows by two rows from among part of all the rows. In the unit pixel cells belonging to the selected row, the signal corresponding to the optical image formed in each of the light receiving units using the pupil segmentation on the image sensor 1 through the optical lens 110 is independently read in the non-addition mode. On the other hand, the adding unit of the image sensor 1 adds the signals of the two light receiving units in the microlens 12, in the rows that are not designated as the phase difference AF rows as main image rows.

Figure 29:
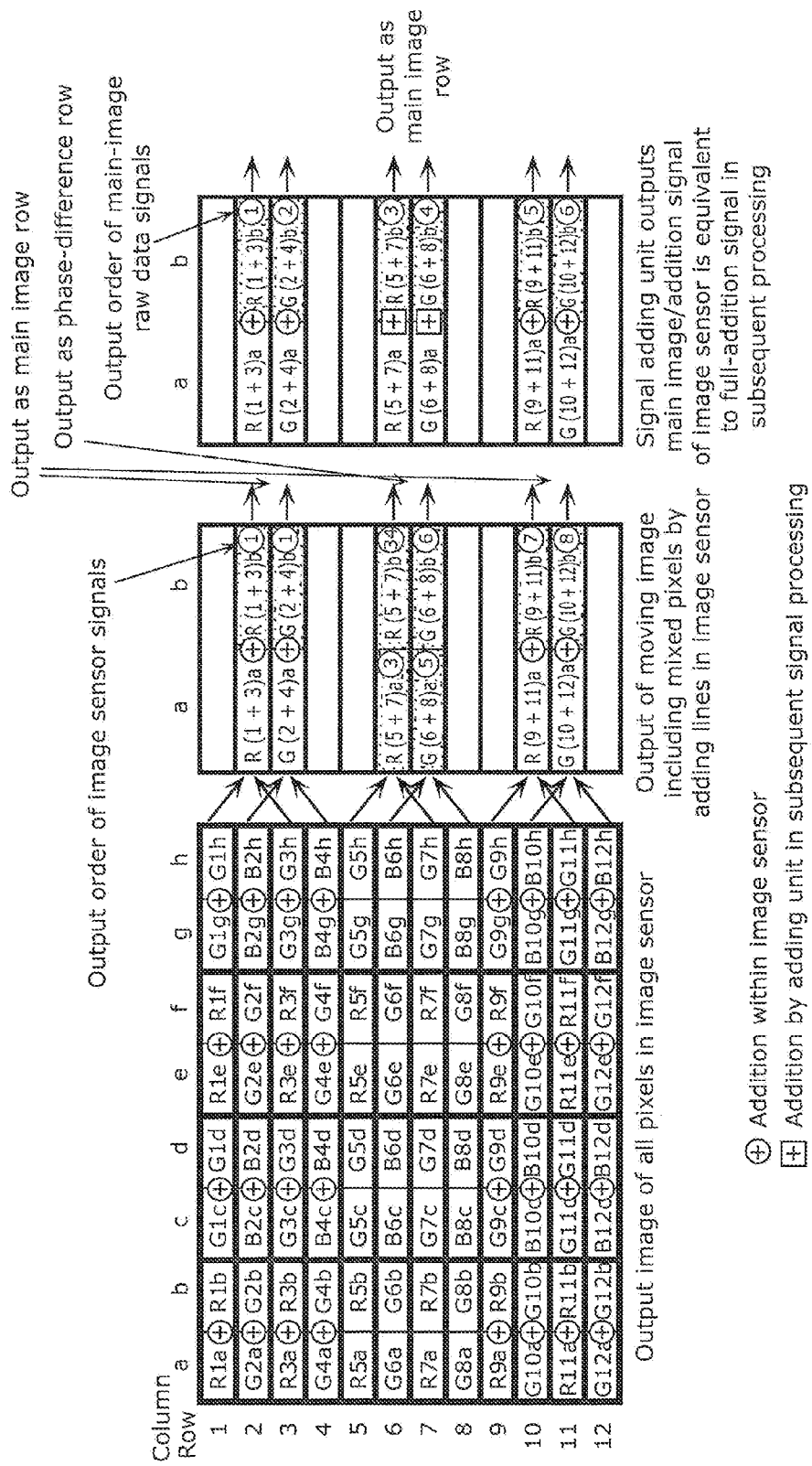
FIG. 29 conceptually illustrates operations for processing a moving image including mixed pixels in capturing a moving image in AF mode according to Embodiment 3.

FIG. 29 conceptually illustrates operations for processing a moving image including mixed pixels in capturing a moving image in AF mode according to Embodiment 3. The left portion of FIG. 29 illustrates addition of signals of the light receiving units in the microlens 12. Furthermore, the central portion of FIG. 29 schematically illustrates output of the image sensor signals after mixing pixels of the same colors in the lines in capturing a moving image, where the microlens 12 is defined as a pixel in the image sensor 1. Additionally, the right portion of FIG. 29 schematically illustrates restoration of the main image at addresses of the phase difference AF rows.

In the example of FIG. 29, the fifth to eight rows are designated as the phase difference AF rows. As illustrated in the left portion of FIG. 29, the signals are individually output from the image sensor 1 on a per light receiving unit basis in the microlens 12. Furthermore, the first to fourth rows and the ninth to 12th rows are designated as the main image rows. As illustrated in the left portion of FIG. 29, in the designated first to fourth rows and the ninth to 12th rows, the signals of the light receiving units within the microlens 12 are horizontally added, and the resulting signals are output from the image sensor 1.

As illustrated in the central portion of FIG. 29, when a moving image in which pixel signals are mixed are driven, the signals in the first row and the third row are mixed to output the resulting signal as a signal in the second row. Furthermore, the signals in the second row and the fourth row are mixed to output the resulting signal as a signal in the third row. Furthermore, the signals in the fifth row and the seventh rows are mixed to output the resulting signal as a signal in the sixth row. Furthermore, the signals in the sixth row and the eighth row are mixed to output the resulting signal as a signal in the seventh row.

Since the phase difference AF rows output signals twice as much as those of the other rows, it takes time for the phase difference AF rows to output, per row, twice as long as that of the main image rows. The number of the phase difference AF rows to be designated is approximately less than 20 rows. Thus, the increased number of rows is approximately less than 10 rows, and can be included in the vertical blanking period, which does not increase one frame period.

In the fifth to eighth rows that are the phase difference AF rows, the phase-difference raw data signals are output to the sixth and seventh rows as the output of a moving image by the image sensor in the central portion of FIG. 29.

The raw data selecting unit 221 in FIG. 28 selects the phase-difference raw data output signals including the phase difference information of the optical lens 110. The phase difference detecting unit 130 outputs the signals as the phase-difference raw data signals as they are, and detects the focal point. Next, in the phase difference detecting unit 130 as illustrated in FIG. 9, in order that the pupil plane left-right selecting unit 131 selectively separates signals corresponding to the left-right pupil planes and detects the phase difference, the color carrier suppressing unit 132 performs LPF processing to remove the color carrier. The left-right signal phase difference detecting unit 133 detects the phase difference, and communicates with the CPU 400 via the CPU I/F unit 134 on the CPU bus, based on the result of detection. The detailed operations of the phase difference detecting unit 130 are illustrated in FIG. 10. Specifically, the phase difference detecting unit 130 selectively separates signals corresponding to the left-right pupil planes, adds the signals of the left and right RGB Bayer array signals, and obtains the phase difference detection signal for each of the left and right pupils to suppress the color carrier.

Since the phase difference AF rows are selected by two rows, the vertically adjacent RG rows and GB rows can be selected, and the phase difference can be detected using the signals including all the RGB components without disturbing an RGB Bayer array of the main image.

The raw data selecting unit 221 selects the main image row data output signal obtained by adding signals of the two light receiving units in FIG. 29. In the first and third rows, the addition resulting signals of R(1+3)a and R(1+3)b of the image sensor 1 are output as the main image row data signals as they are with selection of the upper contact of a main image signal adding unit selection switch 326.

Furthermore, the raw data selecting unit 221 selects the phase-difference raw data signals. R(5+7)a is temporarily stored in the buffer memory, and is added to R(5+7)b by a main image signal adding unit 329. Similarly, G(6+8)a in the next row is temporarily stored in the buffer memory, and is added to G(6+8)b by the main image signal adding unit 329. Here, the lower contact of the main image signal adding unit selection switch 326 is selected, and the resulting signal is output as a main-image raw data signal.

All the main-image raw data for a moving image is created with the series of operations, and is output to the camera YC processing unit 140.

Next, the CPU 400 that obtains information on the result of phase difference detection performs a distance calculation, and temporarily completes the AF focus operation by causing the lens driving unit 180 to move the focus lens of the optical lens 110 to an appropriate position (S53).

The main-image raw data for a moving image can be directly used as moving image data.

Figure 30:
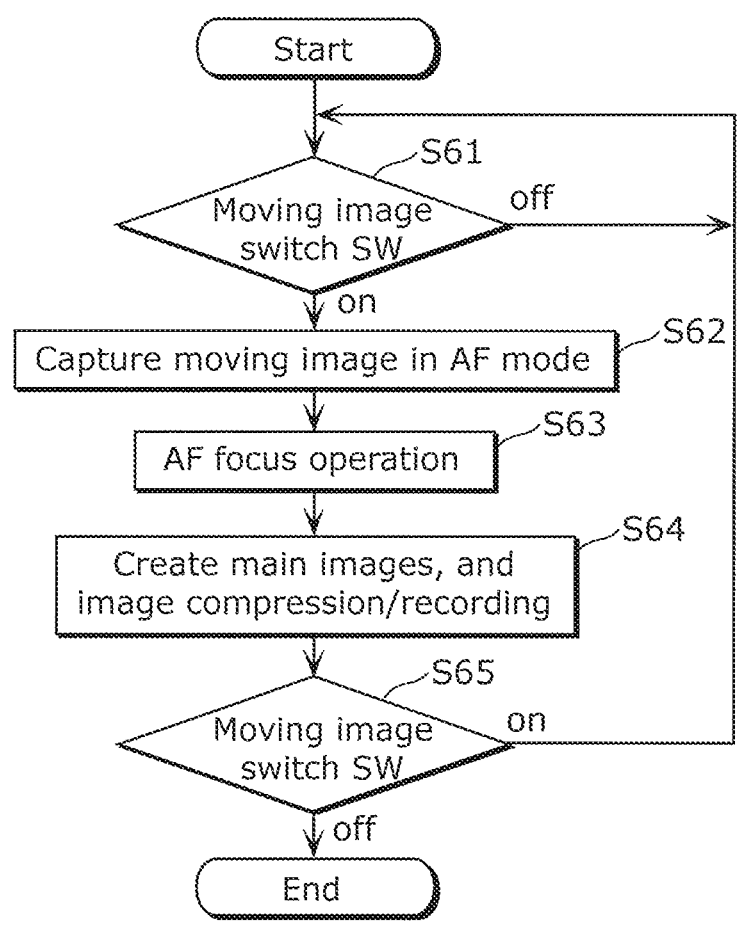
FIG. 30 is an operation flowchart for recording a moving image by the imaging apparatus according to Embodiment 3.

FIG. 30 is an operation flowchart for recording a moving image by the imaging apparatus 300 according to Embodiment 3. As indicated in FIG. 30, when the main-image raw data for a moving image is compressed and recorded, the moving image can be recorded without any degradation in image quality in the phase difference AF.

Next, a release switch SW2 is turned ON, such as depressing the shutter button fully (ON at S54). Accordingly, still images for the main images start to be captured (S55).

The detailed operations after starting to capture still images for the main images in AF mode are basically the same as those according to Embodiment 1. Specifically, at the beginning of the period for storing the captured main images, the reset operation of the image sensor 1 is stopped, and the operations as same as those in the AF shooting mode are performed in the non-destructive readout mode (S56). If necessary, the focus motor is fine-tuned based on the result of phase difference detection of the obtained main images, that is, the AF focal point is fine-tuned (S57).

Next, at the end of and after the period for storing the captured main images, the main images are read. Specifically, each of the light receiving units separated to the left and right by the optical lens pupil plane in the microlens 12 detects a signal. Then, the adding unit 17 adds the signals, and the image sensor 1 outputs the resulting signal to read the main image. Here, the main image capturing mode is finished (S58).

Furthermore, the output pixel image is as illustrated in FIG. 11, which is equivalent to the general Bayer array of still images in which the microlens 12 is defined as a pixel.

The operations of the imaging apparatus 300 are basically the same as those of a digital camera with a general Bayer array. More specifically, the raw data selecting and signal adding unit 320 in FIG. 26 selects the main-image raw data output as a main image. Then, the compression recording unit 150 compresses the image in JPEG or others through the camera YC processing unit 140, and the data is recorded in a medium, completing the still image capturing operation (S59).

With the operations of the imaging apparatus 300, the phase difference signals of the light receiving units separated individually to the left and right by the optical lens pupil plane are obtained. The light receiving units are held in all the unit pixel cells belonging to the phase difference AF designated row. Accordingly, the focus detection accuracy of the phase difference AF can be increased. Furthermore, all the RGB color components can be used for detecting a focal point, thus reducing the influence of the color of an object on the accuracy for detecting the focal point. Furthermore, the focal point can be detected in a non-destructive readout mode during a period for storing charge of the main image signal, thus increasing the reliability of AF against movement of the object.

Furthermore, designation of the phase difference AF row in moving and still images is changed in the series of operations. More specifically, the raw data selecting and signal adding unit 320 changes designation of rows and columns in which the microlens 12 is defined as one unit, for the light receiving units that should generate the non-addition independent signals, according to (i) a still-image capturing mode for outputting the full-addition signal for each of the microlenses 12 and (ii) a moving-image capturing mode for adding the full-addition signals in the unit and outputting a resulting signal, and for downsampling the full-addition signals in the unit and outputting a resulting signal. Accordingly, while using the image-plane phase difference AF function, the image signal can be output without any degradation in image quality of moving and still images due to the phase difference AF function.

(Summary)

The imaging apparatus and the solid-state imaging device disclosed herein can avoid a malfunction caused by aliasing in the image-plane phase difference AF operations, and obtain, from the same frame, signals of the light receiving units in one microlens through which the beam separated by the optical lens pupil plane passes. Accordingly, the accuracy of the image-plane phase difference AF can be greatly increased. Furthermore, while a focal point is detected within the same frame from the signal output from the image sensor as the phase-difference raw data, the signal adding unit in the subsequent signal processing can completely restore image information of the main image. Accordingly, the continuous shooting and capturing a moving image are possible using the image-plane phase difference AF without any degradation in image quality.

Furthermore, since the full-addition signal, the partition addition signal, and the non-addition independent signals are generated based on the photoelectric conversion signals obtained from the same frame, the image-plane phase difference AF shooting and capturing main images are compatible, and the phase difference can be detected with high accuracy.

Furthermore, in downsampling and reading pixel rows in the moving-image capturing mode or adding and reading rows of the pixels of the same color, the necessary row can be designated as a phase-difference raw data output row. Accordingly, by appropriately changing the still-image mode and the phase-difference raw data output row, a camera with image-plane phase difference AF function can completely switch between still images and a moving image without any degradation in image quality.

The imaging apparatus and the solid-state imaging device having (i) phase difference rows from which partial addition signals and non-addition independent signals that are focal-point-adjustment signals are output and (ii) main image rows from which signals for generating image data are output according to the present disclosure can solve a problem in, when the solid-state imaging device outputs pixel rows according to a predetermined mixture procedure, interpolating a particular main image row to be mixed with a phase difference row, using output of the particular main image row and mixed output of main image rows surrounding the particular main image row.

More specifically, in the semiconductor processes in manufacturing an image sensor, addresses for the image-plane phase difference AF can be arbitrarily set without differentiating between the first pixels from which focal-point-adjustment signals are output using photo masks and the second pixels from which signals for generating image data are output. Furthermore, a part of beam on the pupil plane in the first pixels is shielded by photo masks, and the shielded portion is lost from the original signals. Thus, the signals for generating accurate image data can be output. Furthermore, degradation in image quality can be prevented without any interpolation of image data, using information from the surrounding pixels. Furthermore, in the moving-image capturing mode in which the pixel rows are output according to a predetermined mixture procedure, when the phase difference AF operations are performed and the main image designated by the phase difference AF pixel address is interpolated, interpolation by mixture of the second pixel rows that are distant is not required. Thus, degradation in image quality by the interpolation can further be prevented.

Furthermore, when the opening of the light receiving unit is created using a photo mask, pixels are not predetermined to be either horizontal detection pixels or vertical detection pixels. Thus, the phase difference of any of all the pixels can be horizontally and vertically detected.

Furthermore, in a structure of one picture element consisting of four pixels, for example, when three pixels are used for detecting the horizontal direction and one pixel is used for detecting the vertical direction, a problem that the vertical phase difference detection accuracy is inferior to the horizontal phase difference detection accuracy can be prevented.

Furthermore, since the AF shooting is compatible with capturing images according to the present disclosure, the image-plane phase difference AF function can be used for a moving image and high-speed continuous shooting in which still images are continuously captured according to the present disclosure.

The imaging apparatus and the solid-state imaging device included in the imaging apparatus that are described based on Embodiments 1 to 3 according to the present disclosure are not limited by Embodiments. Without departing from the scope of the present disclosure, the present disclosure includes an embodiment with some modifications on Embodiments that are conceived by a person skilled in the art, another embodiment obtained through combinations of the constituent elements and steps of different Embodiments in the present disclosure, and various devices each including the imaging apparatus or the solid-state imaging device according to the present disclosure.

Each of the structural elements in each of the above-described embodiments may be configured in the form of an exclusive hardware product, or may be realized by executing a software program suitable for the structural element. Each of the structural elements may be realized by means of a program executing unit, such as a CPU and a processor, reading and executing the software program recorded on a recording medium such as a hard disk or a semiconductor memory. Here, the software program for realizing the imaging apparatus and the solid-state imaging device according to each of the embodiments is a program described below.

The herein disclosed subject matter is to be considered descriptive and illustrative only, and the appended Claims are of a scope intended to cover and encompass not only the particular embodiments disclosed, but also equivalent structures, methods, and/or uses.

INDUSTRIAL APPLICABILITY

The imaging apparatus and the solid-state imaging device according to one or more exemplary embodiments disclosed herein can provide the high-accuracy image-plane phase difference AF function at high speed without any degradation in image quality, and are applicable to the imaging apparatuses, such as digital cameras.

The invention claimed is:

1. An imaging apparatus, comprising:
an optical lens that optically forms an image of light from an object;
a plurality of light receiving units two-dimensionally arranged on a substrate, and each configured to receive the light that has passed through the optical lens, convert the light into a photoelectric conversion signal, and read the photoelectric conversion signal in a non-destructive readout mode;
a plurality of microlenses each placed (i) for every two or more adjacent light receiving units among the light receiving units and (ii) above the two or more adjacent light receiving units;
a signal generating unit configured to read the photoelectric conversion signal from each of the light receiving units, and generate (i) a full-addition signal by adding all of the photoelectric conversion signals obtained in a predetermined frame by the two or more adjacent light receiving units corresponding to one of the microlenses, (ii) a partial addition signal by adding the photoelectric conversion signals obtained by at least one but not all of the two or more adjacent light receiving units, and (iii) non-addition independent signals that are the photoelectric conversion signals of one of the light receiving units;
a phase difference detecting unit configured to detect a focal point from the partial addition signal and the non-addition independent signals, based on a phase difference between the two or more adjacent light receiving units; and
a YC processing unit configured to generate a main image from the full-addition signal.

2. The imaging apparatus according to claim 1, wherein each of the light receiving units includes a photoconductive film above the substrate and below a corresponding one of the microlenses.

3. The imaging apparatus according to claim 1, comprising:
an image sensor; and
a signal processing circuit that processes a pixel signal output from the image sensor, the image sensor including:
the light receiving units;
a selecting circuit that selectively controls orders of reading pixel signals from the light receiving units to the signal generating unit; and
the signal generating unit, and
the signal processing circuit including:
the phase difference detecting unit; and
the YC processing unit.

4. The imaging apparatus according to claim 3,
wherein each of the microlenses is placed (i) for every two adjacent light receiving units among the light receiving units and (ii) above the two adjacent light receiving units,
the signal generating unit is configured to generate non-addition independent signals, and an addition signal by adding the photoelectric conversion signals obtained in the predetermined frame by the two adjacent light receiving units that correspond to one of the microlenses,
the imaging apparatus further comprises a sensor driving unit configured to set output timing of the addition signal and the non-addition independent signals per row or column,
the phase difference detecting unit is configured to detect the focal point from the non-addition independent signals, and
the YC processing unit is configured to generate a main image from the addition signal.

5. The imaging apparatus according to claim 4,
wherein the signal generating unit is configured to:
output the non-addition independent signals to the phase difference detecting unit in the non-destructive readout mode at the beginning of a charge storage period in which charge generated from the light received by each of the light receiving units is continuously stored without being reset; and
output the addition signal to the YC processing unit at the end of and after the charge storage period.

6. The imaging apparatus according to claim 4,
wherein when a row is designated for the two adjacent light receiving units corresponding to the one of microlenses as light receiving units that should generate the non-addition independent signals, the two adjacent light receiving units are horizontally arranged, and the signal generating unit is configured to horizontally add the photoelectric conversion signals obtained by the light receiving units belonging to the designated row, and
when a column is designated for the two adjacent light receiving units corresponding to the one of microlenses as light receiving units that should generate the non-addition independent signals, the two adjacent light receiving units are vertically arranged, and the signal generating unit is configured to vertically add the photoelectric conversion signals obtained by the light receiving units belonging to the designated column.

7. The imaging apparatus according to claim 1,
wherein the signal generating unit is configured to:
output the partial addition signal and the non-addition independent signals to the phase difference detecting unit in the non-destructive readout mode at the beginning of a charge storage period in which charge generated from the light received by each of the light receiving units is continuously stored without being reset; and
output the full-addition signal to the YC processing unit at the end of and after the charge storage period.

8. The imaging apparatus according to claim 1,
wherein the signal generating unit includes:
a signal selecting unit configured to select one of (i) the partial addition signal and the non-addition independent signals and (ii) the full-addition signal; and
a signal adding unit configured to output, to the phase difference detecting unit, the partial addition signal out of (i) the partial addition signal and the non-addition independent signals selected by the signal selecting unit, and output the full-addition signal to the YC processing unit, the partial addition signal being generated by adding the photoelectric conversion signals obtained by at least one but not all of the two or more adjacent light receiving units corresponding to the one of microlenses, the full-addition signal being generated by adding the photoelectric conversion signals obtained by the two or more adjacent light receiving units.

9. The imaging apparatus according to claim 1,
wherein each of the microlenses is placed (i) for every four of the light receiving units in two rows and two columns and (ii) above the four light receiving units, the two rows and the two columns being adjacent to each other,
when a column is designated for the light receiving units that should generate the partial addition signals and the non-addition independent signals, the signal generating unit is configured to horizontally add the photoelectric conversion signals obtained by the light receiving units belonging to the designated column,
when a row is designated for the light receiving units that should generate the partial addition signals and the non-addition independent signals, the signal generating unit is configured to vertically add the photoelectric conversion signals obtained by the light receiving units belonging to the designated row, and
when both a row and a column are designated for the light receiving units that should generate the partial addition signals and the non-addition independent signals, the signal generating unit is configured to independently read the photoelectric conversion signals obtained by the light receiving units belonging to the designated row and column.

10. The imaging apparatus according to claim 1,
wherein the light receiving units corresponding to each of the microlenses include color filters of a same color.

11. The imaging apparatus according to claim 10,
wherein color filters including the color filters are arranged as an RGB Bayer array.

12. The imaging apparatus according to claim 11,
wherein in a matrix in which each of the microlenses is defined as one unit, rows or columns are designated by two rows or two columns for the light receiving units that should generate the partial addition signals and the non-addition independent signals.

13. The imaging apparatus according to claim 1,
wherein the signal generating unit is configured to change designation of rows and columns in which each of the microlenses is defined as one unit, for the light receiving units that should generate the partial addition signals and the non-addition independent signals, according to (i) a still-image capturing mode for outputting the full-addition signal for each of the microlenses and (ii) a moving-image capturing mode for adding the full-addition signals in the unit and outputting a resulting signal, and for downsampling the full-addition signals in the unit and outputting a resulting signal.

14. A solid-state imaging device, comprising:
- a plurality of light receiving units two-dimensionally arranged on a substrate, and each configured to receive light that has passed through an optical lens, convert the light into a photoelectric conversion signal, and read the photoelectric conversion signal in a non-destructive readout mode, the optical lens optically forming an image of light from an object;
- a plurality of microlenses each placed (i) for every two or more adjacent light receiving units among the light receiving units and (ii) above the two or more adjacent light receiving units;
- a signal generating unit configured to read the photoelectric conversion signal from each of the light receiving units, and generate (i) a full-addition signal by adding all of the photoelectric conversion signals obtained in a predetermined frame by the two or more adjacent light receiving units corresponding to one of the microlenses, (ii) a partial addition signal by adding the photoelectric conversion signals obtained by at least one but not all of the two or more adjacent light receiving units, and (iii) non-addition independent signals that are the photoelectric conversion signals of one of the light receiving units; and
- a selecting circuit that selectively controls orders of reading the photoelectric conversion signals from the light receiving units to the signal generating unit.

\* \* \* \* \*